May 10, 1966 P. J. W. JOCHEMS ETAL 3,250,968

SEMICONDUCTOR DEVICE, NETWORK, AND INTEGRATED CIRCUIT

Filed July 13, 1962 9 Sheets-Sheet 1

INVENTOR
PIETER J.W.JOCHEMS
HENDRIKUS G.KOCK

SEMICONDUCTOR DEVICE, NETWORK, AND INTEGRATED CIRCUIT

INVENTOR
PIETER J.W.JOCHEMS
HENDRIKUS G.KOCK

SEMICONDUCTOR DEVICE, NETWORK, AND INTEGRATED CIRCUIT

Filed July 13, 1962 9 Sheets-Sheet 3

INVENTOR
PIETER J. W. JOCHEMS
HENDRIKUS G. KOCK

SEMICONDUCTOR DEVICE, NETWORK, AND INTEGRATED CIRCUIT

Filed July 13, 1962 9 Sheets-Sheet 4

INVENTOR
PIETER J.W.JOCHEMS
HENDRIKUS G. KOCK

INVENTOR
PIETER J.W. JOCHEMS
HENDRIKUS G. KOCK

SEMICONDUCTOR DEVICE, NETWORK, AND INTEGRATED CIRCUIT

Filed July 13, 1962 9 Sheets-Sheet 6

INVENTOR
PIETER J.W.JOCHEMS
HENDRIKUS G.KOCK
BY

AGENT

INVENTOR
PIETER J.W. JOCHEMS
HENDRIKUS G KOCK

SEMICONDUCTOR DEVICE, NETWORK, AND INTEGRATED CIRCUIT

Filed July 13, 1962 9 Sheets-Sheet 8

INVENTOR
PIETER J.W.JOCHEMS
HENDRIKUS G.KOCK

INVENTOR
PIETER J.W.JOCHEMS
HENDRIKUS G.KOCK 3,250,968
Patented May 10, 1966

3,250,968

SEMICONDUCTOR DEVICE, NETWORK, AND INTEGRATED CIRCUIT

Pieter Johannes Wilhelmus Jochems and Hendrikus Gerardus Kock, Emmasingel, Eindhoven, Netherlands, assignors to North American Philips Company, Inc., a corporation of Delaware Filed July 13, 1962, Ser. No. 209,499
Claims priority, application Netherlands, Aug. 17, 1961, 268,355
25 Claims. (Cl. 317—235)

The invention relates to a semi-conductor device comprising a semi-conductor body having at least one transistor structure and, in particular to such a semi-conductor device in which a transistor structure is associated with at least one further circuit element by means of a common semi-conductor body. The invention furthermore relates to methods for the manufacture of such a semi-conductor device and to the semi-conductor device manufactured by carrying out a method according to the invention.

A transistor structure is to denote herein, in a broad sense, a sequence of three or more layers comprised in a semi-conductor body and having alternately different conductivity types, while at least three layers are provided with an electric connection to a further circuit element, for example a connection comprised in the semi-conductor body or a contact permitting the establishment of an electric connection. One of the most frequently used transistor structures is the three-layer transistor (npn or pnp) with consecutive emitter layer, base layer and collector layer, while by way of example reference is made to a further known four-layer transistor structure (pnpn), in which apart from the layers lying on the outer side at least one further intermediate layer is provided with an electric connection.

With the conventional construction of such transistor structures, in which the pn-junctions between the consecutive layers extend for the major part parallel to each other in the semi-conductor body, particularly if we are concerned with a transistor structure having one or more thin intermediate layers, it is often a problem to provide electric connections on the outer layers and on one or more intermediate layers in a simple, efficacious manner without impeding the manufacture of the layers themselves. This problem becomes particularly manifest in the manufacture of semi-conductor devices, in which a transistor structure having one or more further circuit elements forms a functional unit in a common semi-conductor body. The further circuit element, which may be a semi-conductor part operating as a resistance or a capacitor medium or as a diode or a capacitor with a pn-junction or may be a further transistor structure or usually even a cascade of different circuit elements or electrical components of this kind, must be such that it can be incorporated in the semi-conductor body in a simple, efficacious manner and be connected to the layer concerned of the transistor structure, often with an intermediate layer, while, moreover, the further required connections to other layers must be obtainable in a simple manner. In many cases there is the problem of incorporating and connecting two layers of the transistor structure each with one or more further circuit elements in the semi-conductor body. The association of two or more transistor structures in a common semi-conductor body often gives rise to the problem of interconnecting two corresponding layers of the transistor structures in the body, as the case may be with the interposition of a further circuit element, while, moreover, the common layer and the further layers must be accessible in a simple manner for electric connection or there may be the problem of inter-connecting two non-corresponding intermediate layers of the two transistor structures in the body.

Such problems cannot be solved, at least not in an efficacious manner, when the conventional construction of a transistor structure is employed.

The invention has for its object inter alia to provide a particularly efficacious, simply realisable construction of a transistor structure which provides a considerable simplification of the electric connection problems and to provide particular possibilities of use of this transistor structure in semi-conductor devices in which this structure is associated with one or more further circuit elements or components in a common semi-conductor body. The invention has furthermore for its object to provide particularly efficient methods of manufacturing semi-conductor devices having such a transistor structure.

With a semi-conductor device having a semi-conductor body comprising at least one transistor structure, the semi-conductor body comprises, in accordance with the invention, two regions separated from each other by a pn-junction extending partially transversely in a plate-shaped part of the semi-conductor body, which junction intersects two different faces of the body, while by a local deflection of this pn-junction from the transverse direction at least one of the said regions forms an overlapping zone on the other region, said overlapping zone constituting at least partly an active intermediate layer of the transistor structure, which intermediate layer is at least connected with a part of said one region joining said overlapping zone and is of the same conductivity type as said joining part. An active intermediate layer of a transistor structure is to be understood to mean herein, as usual, that portion of a layer separating two layers of a certain conductivity type and having the opposite conductivity type, by which the charge carriers, usually minority charge carriers are transported between the two said layers, for example with a pnp- or an npn-alloy transistor with a local emitter layer on a larger base layer that portion of the base layer lying in between the emitter layer and below the local emitter layer and the collector layer.

Although this transistor structure may be employed with similar advantages with a transistor comprising more than three layers, it is particularly important for use in a semi-conductor device according to the invention, in which the transistor structure is a three-layer transistor having an emitter layer, a base layer and a collector layer, the collector layer being formed by the said other region supporting the overlapping zone, or at least by a part thereof adjacent the said pn-junction, while the emitter layer is located on the side of the overlapping zone remote from this other region and the overlapping zone comprises the active portion of the base layer.

This particular construction of a transistor structure according to the invention provides a particularly favourable conjunction of two advantages: on the one hand, owing to the local deflection of the pn-junction the active portion of the intermediate layer can be provided in the overlapping zone, so that this active portion can be adapted, at will and independently of the remaining part of the structure, to the requirements with respect to dimensions, for example the thickness. On the other hand, owing to the complete severing by the pn-junction in the transverse direction the body is divided into two regions which may be of any desired shape and size, one region joining the active portion of the intermediate layer and the other joining a further layer of the transistor, so that the said regions and their available, large free surfaces are available for establishing electric connections to the layers of the transistor and, if desired, for accommodating further circuit elements in or on the body and their connections to the layers concerned.

The invention may be used advantageously with a semi-conductor device, the semi-conductor body of which comprises only a transistor structure, while in a simple manner the same face of the body may be provided on the two regions with electric connections in the form of contacts, for example side by side. However, the invention is particularly important for those semi-conductor devices in which a transistor structure is associated with at least one further circuit element or electrical component by means of a common semi-conductor body. In accordance with the invention at least one of the regions separated by the said partially transverse pn-junction in the transistor structure is provided with at least part of at least one further circuit element. The invention permits of incorporating in one of the two regions, in a simple manner, one or more circuit elements and of connecting them without restricting the possibility of connection in the other region. Since also the said one region forming the overlapping zone can accommodate at least one further circuit element or, if desired, only part of a circuit element, the invention permits of connecting the usually thin intermediate layer of a transistor structure to further circuit elements or components in a simple manner and of accommodating these circuit elements in the one region, which may be of any desired size and shape. At the same time the other region, which provides a connection to a further layer of the transistor structure, provides similar ample possibilities of establishing a connection to one or more further circuit elements and the accommodation of these further circuit elements in the semi-conductor body. Further circuit elements may be one or more of the abovementioned resistances, capacitors and diodes. As will be described hereinafter with reference to the embodiments, the transistor structure according to the invention is particularly advantageous for association with a further transistor structure in the semi-conductor body, to which end at least one of the said regions is provided with at least one further transistor structure, which may differ from the structure according to the invention.

For the manufacture of the particular form of the transistor structure according to the invention, in a semi-conductor body use may be made of various conventional techniques in the semi-conductor field for doping with impurities either separately or in conjunction. With one embodiment of the method according to the invention, which has proved to be particularly efficacious, at least one of the said transistor structures with partly transverse pn-junction is manufactured by providing a semi-conductor body with a plate-shaped part intersected transversely by a pn-junction locally on one side of the pn-junction with a layer of opposite conductivity type forming said overlapping zone and establishing on the said side the deflection of the pn-junction and joining the other side of the pn-junction and by providing this overlapping zone at least locally on the side remote from the starting body with a layer of a conductivity type opposite that of the overlapping zone. The pn-junction intersecting transversely the starting body is preferably obtained by doping with impurities during the growth of the semi-conductor body from a melt or vapour of the semi-conductor material, for example by crystal drawing, zone-melting or precipitation from the vapour phase. The layer forming the overlapping zone may be obtained, for example, by alloying electrode material containing the active impurity of the conductivity type concerned and by subsequent recrystallisation from the melt of the electrode material, after which the remainder of the electrode material can be removed. It has been found to be particularly advantageous to form the overlapping zone by diffusion of an impurity in the starting body or by epitaxial growth from the vapour phase, i.e. by vaporizing over semi-conductor material or by dissociation of compounds of the semi-conductor in the vapour phase. The two techniques permit of obtaining in a simple manner an overlapping zone with accurate dimensions. By a separate treatment, for example, by alloying the side of the overlapping zone remote from the starting body can be provided with the further layer of opposite conductivity type. According to a further preferred embodiment the overlapping zone and the further layer are manufactured by an alloy-diffusion treatment. To this end a melt of electrode material is formed locally on one side at the side of the pn-junction, while via the melt face, by predominant diffusion of an impurity of a type opposite that of the material beneath the melt face, a diffusion layer is formed, and by cooling, owing to predominant segregation of an impurity of the other type, a crystallisation layer of a conductivity type opposite that of the diffusion layer is deposited on the said diffusion layer together with a remainder of the electrode material to be employed as a contact, while the part of the overlapping zone joining the other side of the pn-junction is also formed by diffusion. The joining part may be obtained by providing previously a diffusion layer at the site intended for the overlapping zone and by causing, during the alloy-diffusion treatment, the melt face to penetrate at least to the same depth as the previously diffused layer, so that the active part of the overlapping zone located beneath the recrystallised layer is independent of the prediffusion treatment. As an alternative, it is possible to obtain, in a particularly simple manner, the adjacent part during the alloy-diffusion treatment by the diffusion of an impurity from the surroundings or from the melt of the electrode material into the face adjacent the melt of the electrode material. The use of an alloy-diffusion treatment in accordance with the invention with a semi-conductor body having a transversely intersecting pn-junction for the manufacture of a semi-conductor device having a transistor structure according to the invention has the particular advantages that the production of the overlapping zone, particularly the part thereof joining the other side of the pn-junction and also the production of the further layer on the overlapping zone with the contact concerned is performed in a simple manner, while, in addition, the production of the active part of the overlapping zone is particularly simple and reproduceable.

Owing to subsequent thermal treatments the transverse pn-junction may shift in place in the semi-conductor body. If desired, this may be counteracted by using in the starting body comparatively slowly diffusing impurities or, if necessary, when locating the overlapping zone, this shift may be taken into account.

The semi-conductor device and the methods according to the invention and particular embodiments thereof will now be described more fully with reference to a few figures and examples.

FIGS. *5a*, *6a*, *7a*, *9a*, *10a* and *11a* show different circuit diagrams of two transistors.

FIGS. *5b*, *5c*, *6b*, *6c*, *6d*, *7b*, *7c*, *9b*, *9c*, *9d*, *10b*, *10c*, *11b*, *11c* show diagrammatically in cross sectional views different embodiments of a semi-conductor device according to the invention, in which a transistor structure according to the invention is associated with a further transistor structure. The numeral of a given figure refers to the figure of a circuit diagram corresponding with the figure concerned.

Figure 12:
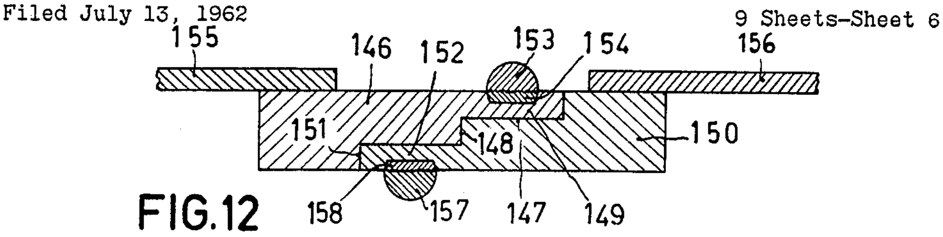

FIG. 12 shows diagrammatically a cross sectional view of a further embodiment of a semi-conductor device according to the invention.

Figure 13:
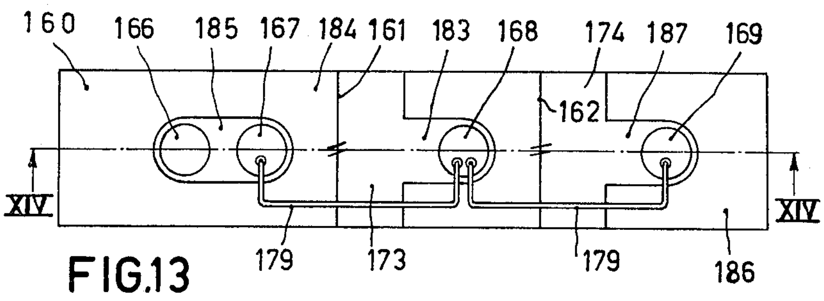
Figure 14:
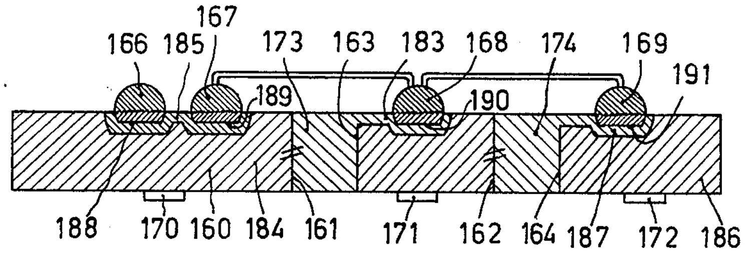

FIGS. 13 and 14 show diagrammatically in a plan view and in a cross sectional view respectively on the broken line XIV—XIV of FIG. 13 one embodiment of a semi-conductor device according to the invention, comprising a multistage cascade amplifier.

Figure 15:
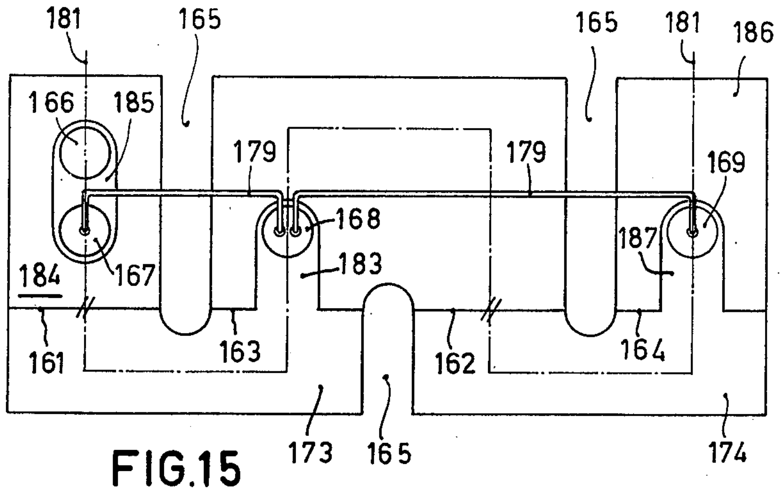
Figure 16:
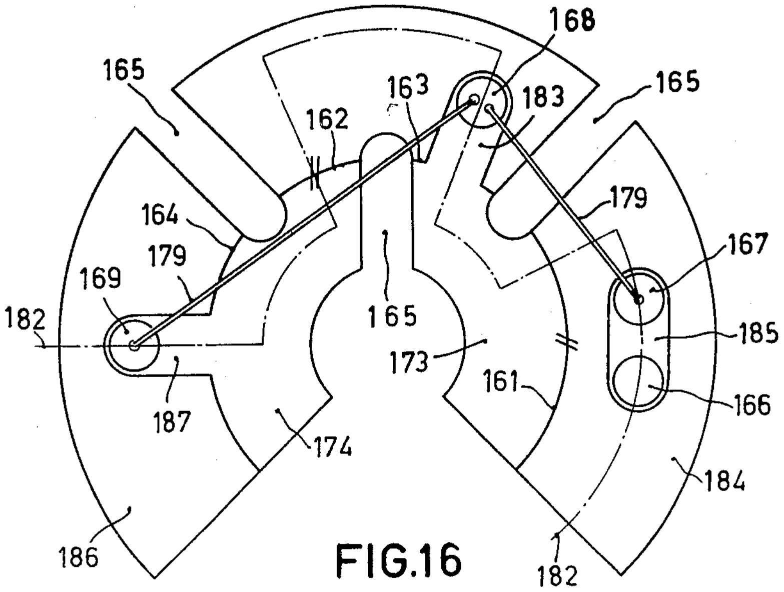

FIGS. 15 and 16 show diagrammatically in a plan view further embodiments of the invention for the devices shown in FIGS. 13 and 14.

Figure 17:
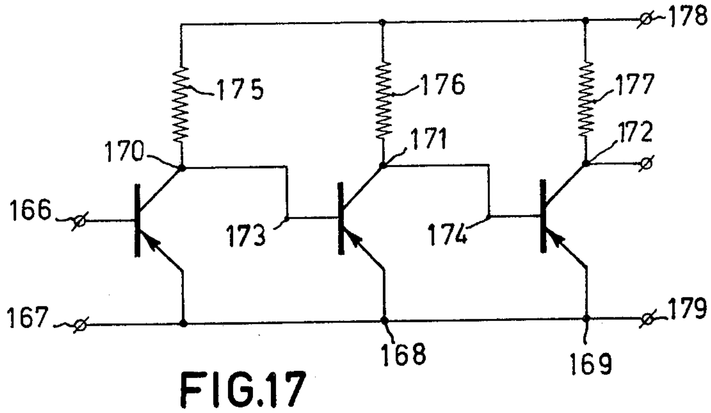

FIG. 17 shows a circuit diagram associated with the FIGS. 13 to 16 and FIG. 18.

Figure 18:
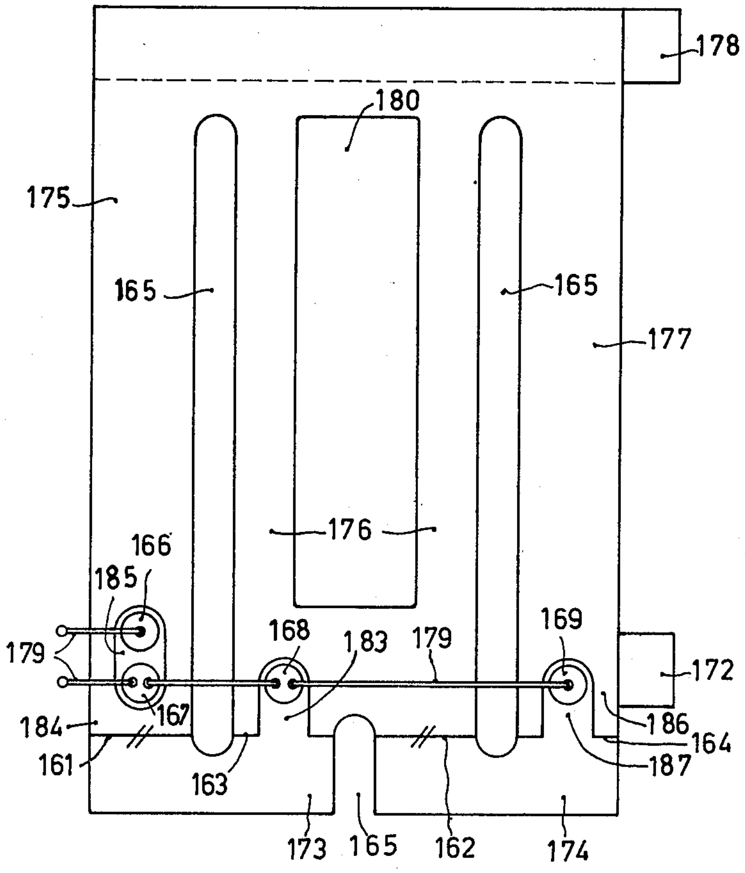

FIG. 18 shows diagrammatically in a plan view one embodiment of a semi-conductor device according to the invention, in which the circuit diagram of FIG. 17 is realized as a whole.

Figure 19:
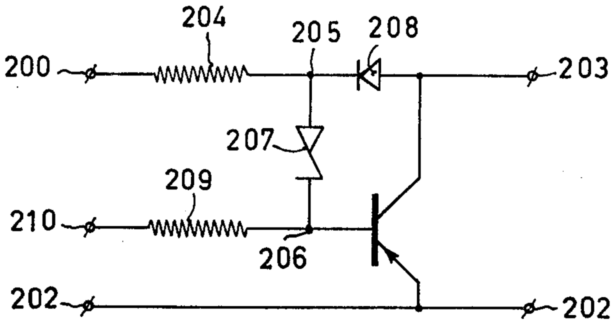

FIG. 19 shows a circuit diagram of an inverter arrangement.

Figures 20, 21, 22, 23, 24:
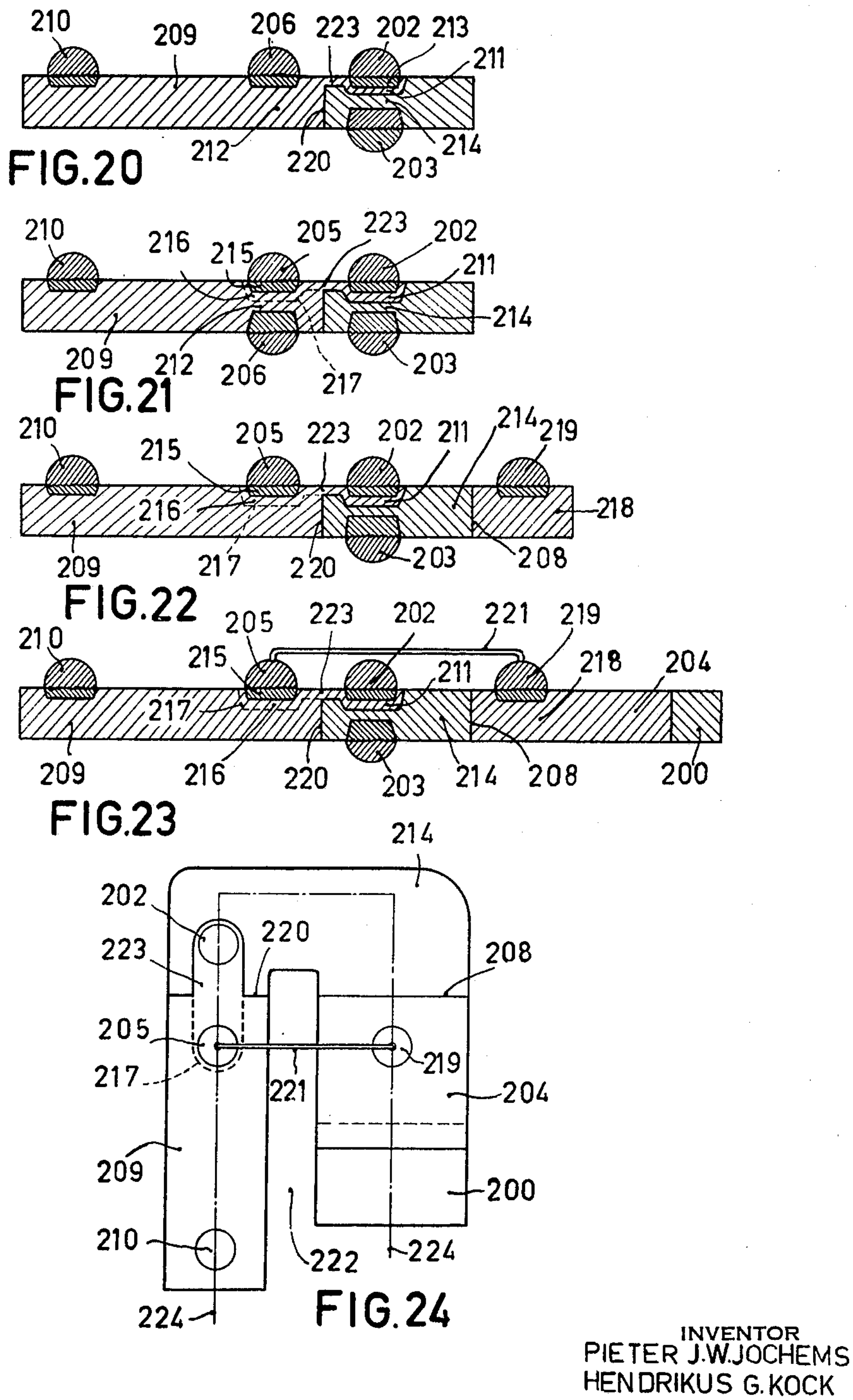

FIGS. 20 to 23 show diagrammatically in sectional views semi-conductor devices according to the invention, in which the circuit diagram of FIG. 19 is realized partly or wholly, whereas FIG. 24 shows a different embodiment of such a semi-conductor device in a diagrammatical plan view.

Figure 1:
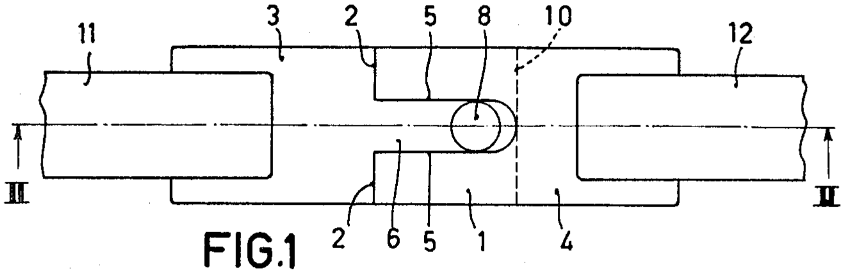
FIGS. 1 and 2 show diagrammatically a plan view and a cross sectional view on the line II—II of one embodiment of a semi-conductor device according to the invention.
Figure 2:
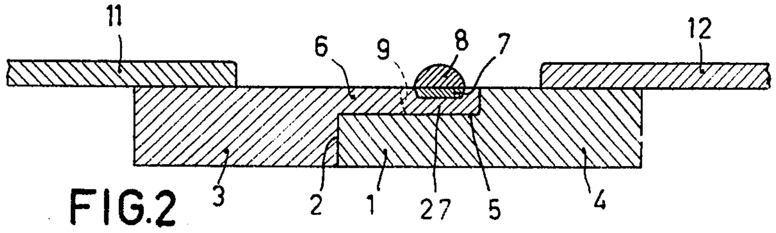

FIGS. 1 and 2 show in a plan view and in a sectional view respectively a semi-conductor device according to the invention, formed by a single transistor. The plate-shaped semi-conductor body 1 is separated into two regions by a pn-junction 2, extending partly in a transverse direction in the semi-conductor body and intersecting the two opposite faces of the body, i.e. one n-conductive region 3 and the other p-conductive region 4. On the upper side of the body the pn-junction 2 has a locally deflected portion 5, so that one region 3 forms an overlapping zone 6 on the other region 4, which zone is adjacent the region 3, both being of the n-conductivity type. As a rule, the transverse part of the pn-junction 2 extends over the major part of the thickness of the plate-shaped portion. On this n-conductive overlapping zone 6 is provided an emitter electrode of the transistor, consisting of a p-conductive layer 7 and a metal contact part 8. The three-layer transistor having an emitter layer, a base layer and a collector layer is formed by the emitter layer 7, the overlapping zone 6 joining one region 3, and the other region 4 respectively. The active portion of the base layer is formed by the part 27 of the overlapping zone 6, for example the part of the overlapping zone 6 lying on the right-hand side of the broken line 9 of FIG. 2 between the emitter layer 7 and the other region 4, operating as a collector layer, since the said part contributes mainly to the transport of minority carriers from the emitter layer 7 to the collector layer 4.

From FIG. 1 it is clearly evident that the pn-junction 2 provides on the upper side of the body the section 5 of the upper face, so that the overlapping zone 6 occupies both in the direction of length and in the direction of width of the upper face only a small portion. Although the embodiment shown is preferred, since the pn-junction occupies therein a comparatively small surface, it is also possible within the scope of this invention, if the capacity of this pn-junction is of minor importance, to provide the overlapping zone throughout the width of the upper face, for example by causing the pn-junction 2 to intersect the upper face along the straight broken line 10 of FIG. 1 instead of on the meandric line (2, 5). Although, as a rule, and preferably the pn-junction intersects two opposite faces of the wafer, it is also possible within the scope of the invention, if for example the transverse part 2 of a pn-junction is located near the edge of the wafer, to cause the overlapping zone to extend up to this edge by causing the pn-junction to intersect at least locally the side instead of the upper face, in which case the bottom face of the other region 3 is nevertheless available as a whole for electric connections.

From FIGS. 1 and 2 it will be seen that the invention permits of establishing, in a particularly simple manner, electric connections, for example in the form of contact strips 11 and 12 via one region 3 to the active base layer 27 and via the other region 4 to the collector layer. These contact strips 11 and 12 may be provided, in the transistor shown in FIGS. 1 and 2, on the upper face and/or on the bottom face. Since the pn-junction 2 intersects always two different faces, usually two opposite faces, the two regions 3 and 4 may be extended at will independently of each other and may, for example, also be larger than the thickness of the plate-shaped portion in the longitudinal direction thereof (see particularly FIG. 2). It is thus possible to provide each of these regions, if desired, simultaneously and, particularly also the region 3, joining the active base zone 27 with further circuit elements, connected to the layer concerned and/or to provide these regions in a simple manner with contacts. If desired, these contacts may have a large surface, which may, for example, be often desirable for power transistors.

Although with the embodiments shown in FIGS. 1 and 2 and also in many further figures the pn-junction 2 forms only one overlapping zone 6, and only one emitter electrode (7, 8) is provided, one or more similar overlapping zones may be formed in a similar manner, for example at the side of the overlapping zone on the upper face or on the bottom face by means of further similar deflections 5 of the same pn-junction 2. These further overlapping zones may also be provided with emitter electrodes, so that multiple transistor structures can be formed in a simple manner.

With the embodiments shown in FIGS. 1 and 2 and also in the figures to be described hereinafter the overlapping zone always constitutes the active base zone of a three-layer transistor. Although the invention is particularly suitable for three-layer transistors, it may be employed with identical advantages with multi-layer transistors, for example a four-layer transistor, formed for example from the three-layer transistor shown in FIGS. 1 and 2 by providing an n-conductive zone between the emitter contact 8 and the emitter layer 7 or by providing an n-conductive layer with a contact on the face of the other region 4 lying opposite the emitter electrode 7, 8. Also with such multi-layer transistors the invention permits of providing two of the intermediate layers with contacts, in a simple manner and/or connecting these intermediate layers in the body to further circuit elements.

In the embodiment shown in FIG. 2 the surface of the body 1, where the overlapping zone 6 is provided, is substantially completely flat and the overlapping zone 6 is located beneath this surface. Such a location of the overlapping zone 6 may be obtained, for example, by arranging the n-conductive overlapping zone 6 in a wafer having a pn-junction initially intersecting this body completely in a transverse direction in the region 4 by local diffusion of a donor, while the face located at the side of the overlapping zone 6 of the other region 4 is screened from this diffusion in known manner by means of a resist layer.

Figure 3:
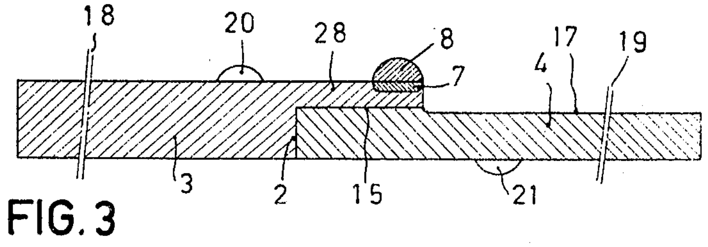
FIGS. 3 and 4 show diagrammatically a cross sectional view of two further different embodiments of a semi-conductor device according to the invention.

FIG. 3 shows a further embodiment of a semi-conductor device according to the invention, which differs from the embodiment shown in FIGS. 1 and 2 mainly in that the overlapping zone 16 and the deflected part 15 of the pn-junction project above the adjacent face 17 of the other region 4 in that the emitter zone 7 and the emitter contact 8 are located on the edge of the overlapping zone 16. The broken lines 18 and 19 indicate diagrammatically that the one region 3 and/or the other region 4 may comprise one or more further circuit elements, while instead thereof or at the same time contacts 20 and 21 may be provided on the upper face or the bottom face of the regions 3 and 4 respectively. With respect to the construction of these further circuit elements further details will be given hereinafter by way of example. The embodiment shown in FIG. 3 may be manufactured, for example, by causing an n-conductive layer to grow in known manner by epitaxial agency from the vapour phase in a wafer initially completely intersected by a pn-junction in a transverse direction only at the place intended for the overlapping zone of the p-region 4. This embodiment may also be obtained by providing on or in the said starting body initially on all sides or in the whole upper face an n-conductive layer by epitaxial agency from the vapour phase or by diffusion of a donor, after which this n-conductive layer is removed by etching with the exception of the part intended to form the overlapping zone 16.

Figure 4:
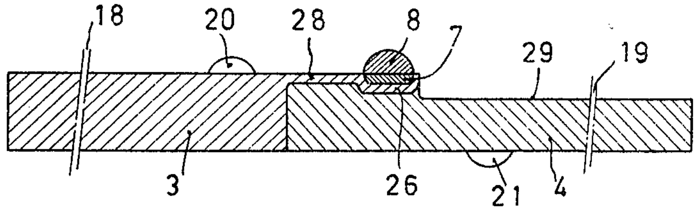
Figure 5A:
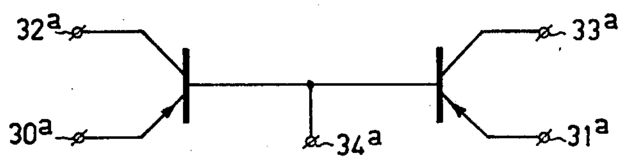
Figure 5B:
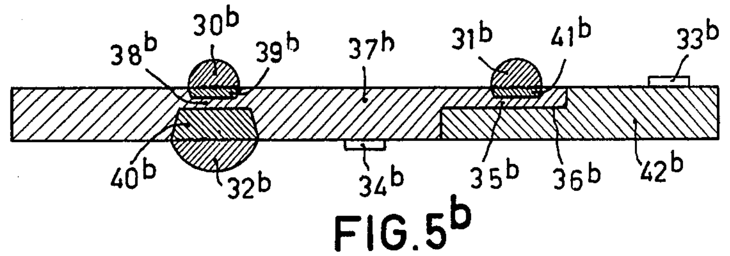
Figure 5C:
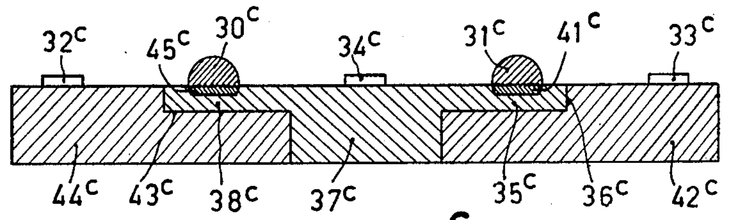

With the embodiments shown in FIGS. 2 and 3 the emitter electrode 7, 8 is obtained in a separate stage by alloying an acceptor impurity. FIG. 4 refers to a preferred embodiment of the invention, in which the overlapping zone 26, 28 and the p-conductive layer 7 with contact 8 are obtained by an alloy-diffusion treatment. Since with an alloy-diffusion treatment the active part 26 of the overlapping zone lying beneath the electrode 7, 8 is formed by the diffusion of an impurity via the melt face of the same melt of the electrode material as that from which, during cooling owing to recrystallisation and segregation of an impurity of opposite conductivity type, the electrode 7, 8 is formed, the part 26 lies at a lower level beneath the surface than the adjacent part 28 of the overlapping zone. This part 28 is formed by diffusion from the surface, since, if the part 28 is formed by a prediffusion treatment, the melt face is chosen in a manner known with alloy-diffusion, at least to the penetration depth of the prediffused layer, while with simultaneous diffusion of the adjacent part 28 during the alloy-diffusion treatment this part is formed starting from the surface. The use of the alloy-diffusion technique with a body transversely intersected by a pn-junction permits of manufacturing, in a simple and accurately reproduceable manner, the active, deeper part 26 with a suitable distribution of impurity concentrations and of obtaining, moreover, in a simple manner, a part 28 engaging the region 3. The diffusing and/or segregating impurities may be contained in the electrode material prior to alloying or they may be supplied in a vapour form during the alloying from the surroundings or, in the case of a prediffused layer, they may be obtained wholly or partly from the prediffused layer. The part of the diffusion layer lying on the other region 4 outside the overlapping zone 26, 28 may be removed by etching, so that the face 29 of the said part lies on a slightly lower level than the remainder of the surface of the body. With respect to the embodiment shown in FIG. 4 the same remarks may otherwise be made as those relating to FIGS. 1 to 3.

With reference to the following figures some further, particular embodiments of a semi-conductor device according to the invention, comprising in at least one of the regions separated by the pn-junction one or more further circuit elements or components will be described more fully. It will first be proved that a transistor structure according to the invention permits in a simple and efficacious manner of incorporation two or more transistors connected in different ways according to the practical desire in a semi-conductor body by providing the transistor structure according to the invention in one or in both regions separated by the pn-junction with a further transistor structure, which may differ from the transistor structure according to the invention or may be constructed in a similar manner. The two transistors may have the same conductivity structure, i.e. in the case of a three-layer transistor, both may be pnp transistors npn transistors or they may be of different conductivity structure, i.e. one pnp transistor and the other an npn transistor.

FIGS. *5a* to *7c* and *9a* to *11c* show the embodiments associated with a given circuit diagram, for example of *5a*, and designated by the same numeral of the figure, in this case 5, but with different references, i.e. *a*, *b* and *c*. The references in each group of associated figures, for example *5a, 5b, 5c,* to functionally corresponding parts have the same reference numeral but different characters corresponding to the figure concerned, since the functionally corresponding parts may be different or may be of different structures.

FIG. *5a* shows the circuit diagram of two transistors of the same conductivity structure, for example of the pnp-type, having emitter connections 30*a* and 31*a* respectively and collector connections 32*a* and 33*a* respectively with a common base connection 34*a*. Such a circuit arrangement of two transistors of the same type is known per se and is employed inter alia in a push-pull amplifier having the two transistors in a common base connection, on in push-pull direct-voltage converters. With a semi-conductor device according to the invention, comprising the circuit arrangement of FIG. *5a*, as is illustrated for example in FIGS. *5b* and *5c* in a diagrammatic sectional view, the active intermediate layer (35*b* and 35*c* respectively), incorporated in an overlapping zone in a transistor structure according to the invention is connected in the semi-conductor body via a part of the same conductivity type (37*b* and 37*c* respectively) of one region forming the overlapping zone to a corresponding intermediate layer (38*b* and 38*c* respectively) of a further transistor structure incorporated in this one region and having the same conductivity structure, in this case pnp. From FIG. *5b* it will be seen that the construction of the further transistor structure with the emitter connection 30*b*, the emitter layer 31*b*, the collector connection 32*b* and the collector layer 40*b* may be different from that of the first-mentioned transistor structure having an emitter connection 31*b*, an emitter layer 41*b*, partly transverse pn-junction 36*b*, a collector connection 33*b* and a collector layer 42*b*. The further transistor structure may be manufactured, for example, by alloying or diffusion. In accordance with the invention, as is shown by way of example in FIG. *5c*, it is advantageous to construct the further transistor structure on the first-mentioned transistor structure by dividing one region forming the overlapping zone 35*c* of the first-mentioned transistor structure by a further, partly transverse pn-junction 43*c*, intersecting two different faces of this one region into two portions 37*c* and 44*c*, the portion 37*c* of which, associated with the first-mentioned pn-junction 36*c* forming, by local deflection of the further pn-junction 43*c*, on the portion 44*c* remote from the first-mentioned pn-junction 36*c*, a further overlapping zone 38*c*, which comprises the active intermediate layer of the further transistor structure. This further transistor structure is thus formed otherwise by an emitter contact 30*c*, an emitter layer 45*c*, a collector contact 32*c* and a collector layer 44*c*. As is shown in FIGS. *5b* and *5c*, the connecting contacts 34*b* and 34*c* respectively are common to the two transistors. These transistors may both be of the pnp-type and may, if desired, be manufactured in the same manner in one process.

FIG. *6a* shows a circuit diagram having two transistors of different conductivity structures, of which the collector 50*a* of one transistor for example a pnp transistor, with an emitter connection 51*a* and a base connection 52*a*, is connected to the base 53*a* of the second transistor, for example an npn transistor, having an emitter connection 54*a* and a collector connection 55*a*. The collector 50*a* of one transistor has a common connection 56*a* to the base 53*a* of the other transistor. Such a circuit arrangement of two transistors of different conductivity structures is known per se and is employed inter alia in direct-voltage cascade amplifiers.

With a suitable embodiment of a semi-conductor device according to the invention, comprising the circuit arrangement of FIG. *6a*, as is shown by way of example in FIGS. *6b* and *6d* in a diagrammatic sectional view, an active intermediate layer (57*b* and 57*d* respectively) of a transistor structure according to the invention, this layer being incorporated in an overlapping zone, is connected via a part (58*b* and 58*d* respectively) of the same conductivity type of the one region forming the overlapping zone in the body to a collector zone (59*b* and 59*d*, respectively) of a further transistor structure, incorporated in this one region and having opposite conductivity structure. From FIG. 6*b* it will be seen that the construction of the further transistor structure, which may be of the pnp-type, having an emitter connecting contact 51*b*, an emitter layer 60*b*, a base zone 61*b* and a base connection 52*b*, may be different from the other transistor structure, which may be of the npn-type, having an emitter connecting contact 54*b*, an emitter layer 62*b*, a partly transverse pn-junction 63*b* and a collector layer 64*b*, and a collector connecting contact 55*b*. The base zone 61*b* may be obtained, for example, by the diffusion of a donor and the emitter electrode 51*b*, 60*b* and the base electrode 52*b* by alloying an active impurity. With a further suitable embodiment of a semi-conductor device according to the invention, comprising the arrangement shown in FIG. 6*a*, as will be seen from FIG. 6*c* and also from FIG. 6*d*, a part (59*c* and 59*d* respectively) of the other region (58*c* and 58*d* respectively) supporting an overlapping zone (66*c* and 66*d* respectively), which part is adjacent the pn-junction (65*c* and 65*d* respectively) of a transistor structure according to the invention, is connected in the body to an active intermediate layer (57*c* and 57*d* respectively) of a further transistor structure of opposite conductivity type, incorporated in this other region (58*c* and 58*d* respectively). From FIG. 6*c* it will be seen that the construction of the further transistor structure, which may be of the npn-type, having an emitter connecting contact 54*c*, an emitter layer 62*c*, a collector connecting contact 55*c*, a collector layer 64*c* and a separate base connecting contact 53*c* may be different from the other transistor structure, which may be of the pnp-type, having an emitter connecting contact 51*c*, an emitter layer 60*c*, a base layer 66*c* and a base connecting contact 52*c*. The emitter electrode 54*c*, 62*c* and the collector electrode 55*c*, 64*c* may be obtained by alloying a donor-containing electrode material. If the overlapping zone 66*c* and the emitter electrode 51*c*, 60*c* are manufactured by alloy-diffusion, while using a predominantly diffusing impurity of one type and a predominantly segregating impurity of the other type, the electrodes 54*c*, 62*c* and 55*c*, 64*c* may advantageously be obtained simultaneously by alloying an electrode material containing an impurity of the same type as, preferably the same impurity as, that used for the formation of the overlapping zone 66*c*.

Figure 6A:
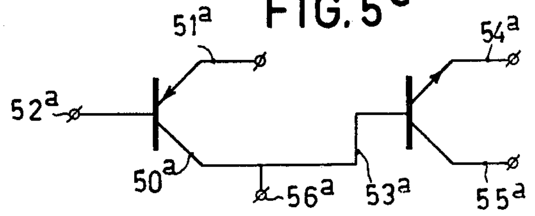
Figure 6B:
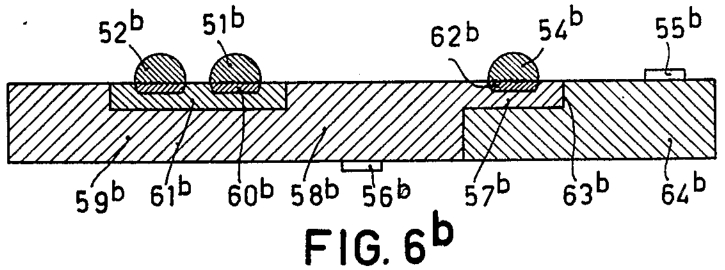
Figure 6C:
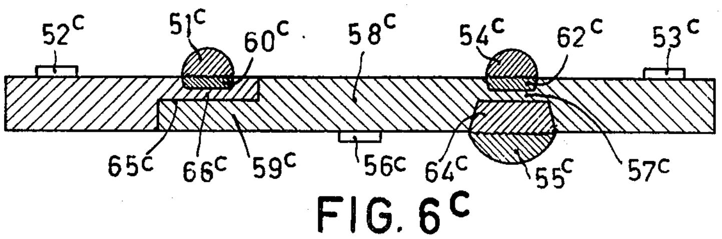
Figure 6D:
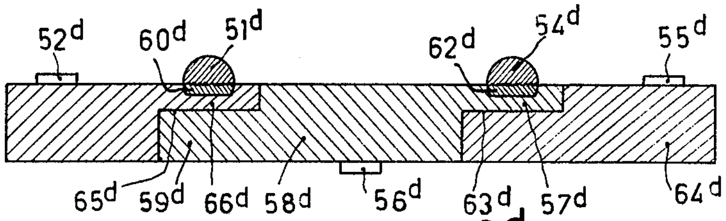

However, a semi-conductor device according to the invention comprising the circuit arrangement shown in FIG. 6*a* can be obtained with great advantage by constructing the further transistor structure in the same manner as the first-mentioned transistor structure. To this end, as is illustrated by way of example in FIG. 6*d*, the other region supporting the overlapping zone 66*d* of a transistor according to the invention is divided by a further, partly transverse pn-junction 63*d*, intersecting different faces of the other region into two portions 58*d*, 64*d* of which the portion 58*d*, adjacent the pn-junction 65*d* of the first-mentioned transistor forms on the remote portion 64*d* a further overlapping zone 57*d*, which comprises the active intermediate layer of the further transistor structure. The two transistor structures, one of which may be of the pnp-type and be formed by an emitter connecting contact 51*d*, an emitter layer 60*d*, a base layer 66*d*, a base connecting contact 52*d* and a collector layer 59*d* and the other transistor structure may be of the npn-type and may be formed by an emitter connecting contact 54*d*, an emitter layer 62*d*, a base layer 57*d*, a collector layer 64*d*, and a collector connecting contact 55*d* have a common connecting contact 56*d*, which is connected via the region 58*d* on the one hand to the collector layer 59*d* of one transistor structure and on the other hand to the base layer 57*d* of the other transistor. By using one or more of the techniques usually employed for a transistor structure, for example alloying, diffusing and/or epitaxial growth from the vapour phase they may be manufactured separately.

Figure 7A:
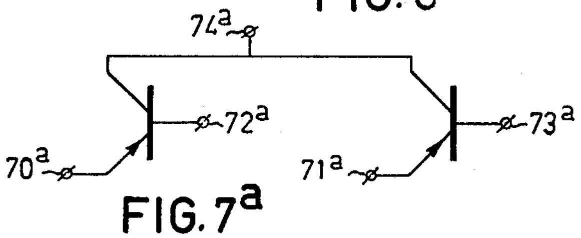

FIG. 7*a* shows a circuit diagram comprising two transistors of the same conductivity type, for example of the pnp-type, having emitter connections 70*a* and 71*a* respectively, base connections 72*a* and 73*a*, respectively, and a common collector connection 74*a*. Such an arrangement of two transistors of the same type is known per se and is employed inter alia in push-pull amplifiers in which the transistors are used in common collector connection.

Figure 7B:
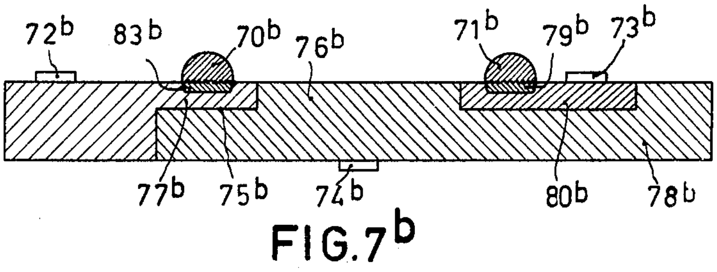
Figure 7C:
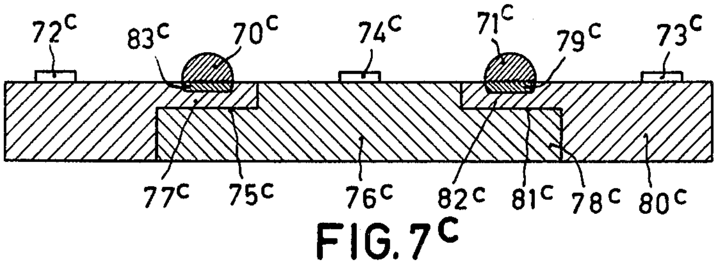

With an embodiment of a semi-conductor device according to the invention, corresponding with the arrangement shown in FIG. 7*a*, as is illustrated by way of example in FIG. 7*b* and FIG. 7*c* in a diagrammatic sectional view, a part (76*b* and 76*c* respectively) of the other region supporting an overlapping zone (77*b* and 77*c* respectively), which part is adjacent the pn-junction (75*b* and 75*c* respectively) of a transistor structure according to the invention is connected, to this end, in the body, via a part of the same conductivity type to a collector zone (78*b* and 78*c* respectively) of a further transistor structure of the same conductivity structure, incorporated in the said other region. From FIG. 7*b*, it will be seen that the construction of the further transistor structure having an emitter electrode 71*b*, 79*b*, a base layer 80*b* and a base contact 73*b* may differ from the construction of the first-mentioned transistor structure having an emitter contact 70*b*, an emitted layer 83*b*, a base layer 77*b*, a base contact 72*b*, and a collector layer 76*b*. The emitter electrode 71*b*, 79*b* and the base layer 80*b* and the base contact 73*b* may be obtained by using an alloy-diffusion process, if desired simultaneously with the manufacture of the overlapping zone (77*b* and the electrode 70*b*, 71*b* by alloy-diffusion).

According to a further embodiment of a semi-conductor device comprising the circuit arrangement of FIG. 7*a* the further transistor structure is constructed similarly to the first-mentioned transistor structure. To this end, as is illustrated by way of example in FIG. 7*c* in a diagrammatic sectional view, the other region 76*c* supporting an overlapping zone 77*c* is divided by a further, partly transverse pn-junction 81*c*, intersecting two different faces, into two portions, of which the portion 80*c* remote from the pn-junction 75*c* of the first-mentioned transistor structure forms, on the other portion 76*c*, 78*c*, adjacent the pn-junction 75*c*, a further overlapping zone 82*c*, which comprises an intermediate layer of a further transistor structure of the same conductivity structure. The two transistor structures may be manufactured, if desired, simultaneously and in the same manner in a single alloy-diffusion process.

In FIGS. 7*b* and 7*c* the two transistor structures are provided with a common collector connecting contact (74*b*, 74*c* respectively), which is ohmically connected via the common portion 76*b* and 76*c* respectively to the collector layers of the two transistors.

Figure 8:
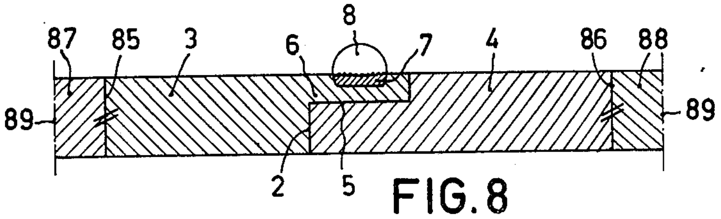
FIG. 8 shows the use of substantially non-blocking p-n junctions in connection with the basic transistor structure.

With the semi-conductor devices according to the invention described above at least one of the regions separated by the pn-junction constitutes a connection between a layer of a given conductivity type of one transistor structure and a layer of the same conductivity type of a further circuit element. It is often required, however, to provide in a semi-conductor body a circuit arrangement in which a layer of a given conductivity type of a transistor structure is connected in series with a layer of opposite conductivity type of a further circuit element. According to a further embodiment of the invention this may be achieved in a simple and efficacious manner with a semi-conductor device in which, as is illustrated by way of example in FIG. 8 in a diagrammatic sectional view, at least one of the regions of the transistor structure according to the invention, i.e. the region forming the overlapping zone 3 and/or the region 4, supporting the overlapping zone, is continued, starting from the partly transverse pn-junction 2, 5 via an auxiliary pn-junction 85 and/or 86, the blocking properties of which are to a substantial extent reduced or even practically annulled, hereinafter termed the substantially non-blocking pn-junction, in a portion 87 and/or 88 of opposite conductivity type, while this continued portion comprises at least part of a further circuit element (shown diagrammatically by broken lines 89). Corresponding parts of FIGS. 8 and 2 are designated by the references of FIG. 2. The configuration is particularly advantageous, if, as is shown in FIG. 8, the auxiliary pn-junction 85, 86 extends in the body parallel to the transverse portions 2 of the other pn-junction and, if desired, intersects the body also in a transverse direction, since the auxiliary pn-junctions can be provided in an effective manner during the manufacture of the starting body by the growth from melt or vapour in the body. The auxiliary pn-junctions 85, 86 can be rendered, in a simple manner, to be substantially non-blocking (indicated in the figure by the two oblique dashes) and practically ohmic by bridging locally the pn-junction concerned by a short-circuiting, conductive strip and/or by damaging, for example by scratching or sandblasting, the surface of the body at the area of the intersection of the pn-junction. It is also possible to obtain a substantially non-blocking pn-junction for instance by doping in a known way the body, for instance only locally at the pn-junction so highly, that the break-down voltage is low and a broad substantially non-blocking voltage range is available. In general the term "substantially non-blocking" should be understood to cover pn-junctions treated or manufactured in such a way, that their blocking properties are not disturbing for the circuit concerned.

It is thus possible, for example, to connect the p-conducting collector layer of the transistor structure to the n-side of a pn-diode, this n-side forming part of the continued region 88.

This particular embodiment offers particular possibilities to provide, in a simple manner, further forms of arrangements between two transistor structures.

Figure 9A:
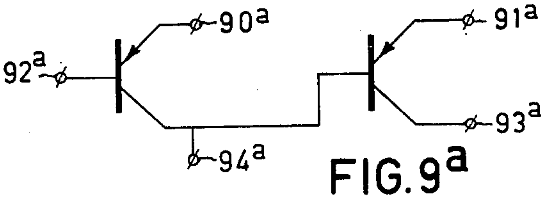

FIG. 9*a* shows a frequently used circuit arrangement of two transistors having the same conductivity structure, for example of the pnp-type, having emitter connections 90*a*, and 91*a* respectively, base connections 92*a*, of one transistor and a collector connection 93*a* of the other transistor, while the collector of one transistor and the base of the other transistor have a common connection 94*a*. Such an arrangement of two transistors of the same type is frequently used in so-called direct-voltage cascade amplifiers.

Figure 9B:
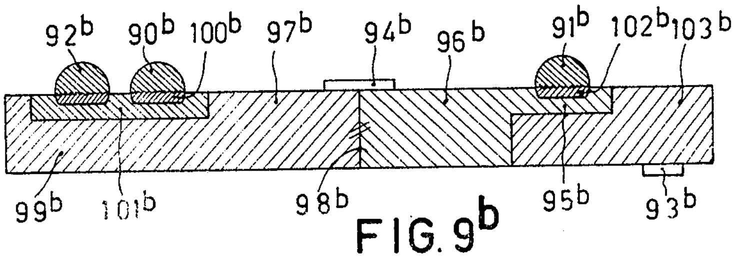
Figure 9C:
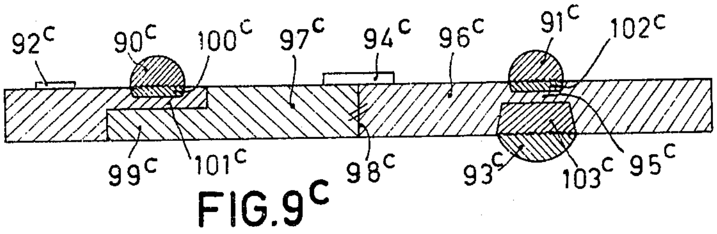
Figure 9D:
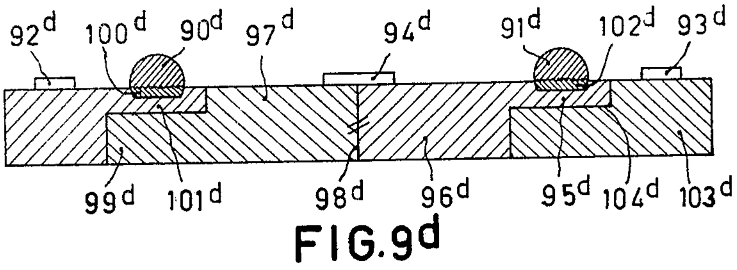

In an effective embodiment of a semi-conductor device according to the invention comprising the arrangement of FIG. 9*a*, as is illustrated by way of example in FIGS. 9*b* and 9*d* in a diagrammatic sectional view, this is achieved in that the one region (96*b*, 96*d* respectively) of a transistor structure forming the overlapping zone (95*b* and 95*d* respectively) is continued in a portion (97*b* and 97*d* respectively) of opposite conductivity type via a non blocking auxiliary pn-junction (98*b* and 98*d* respectively), which portion (97*b* and 97*d* respectively) constitutes at least partly the collector zone (99*b* and 99*d* respectively) of a further transistor structure having the same conductivity structure. From FIG. 9*b* it will be seen that the construction of the further transistor structure, formed by an emitter electrode 90*b*, 100*b*, a base layer 101*b* with a base contact 92*b* and a collector layer 99*b* may be different from that of the first-mentioned transistor structure, formed by an emitter electrode 91*b*, 102*b*, a base zone 95*b*, and a collector layer 103*b* with a collector contact 93*b*. The further transistor structure of FIG. 9*b* may be provided in the body in a particularly simple manner during the manufacture of the overlapping zone 95*b* and the electrode 91*b*, 102*b*, for example by the same alloy-diffusion process.

In a further efficacious embodiment of a semi-conductor device according to the invention the circuit arrangement of FIG. 9*a* is obtained in that, as is illustrated by way of example in FIG. 9*c* and FIG. 9*d*, the other region (97*c* and 97*d* respectively) of a transistor structure supporting the overlapping zone (101*c* and 101*d* respectively) is continued in a portion (96*c* and 96*d* respectively) of opposite conductivity via a practically non-blocking auxiliary pn-junction (98*c* and 98*b* respectively) which portion (96*c* and 96*d* respectively) comprises at least partly an active intermediate layer (95*c* and 95*d* respectively) of a transistor structure of the same conductivity structure. From FIG. 9*c* it will be seen that the construction of the further transistor structure, formed by the emitter electrode 91*c*, 102*c*, the base layer 95*c*, the collector layer 103*c* and the collector contact 93*c*, may be different from the construction of the first-mentioned transistor structure formed by the emitter electrode 90*c*, 100*c*, the base layer 101*c*, the base contact 92*c* and the collector layer 99*c*. The further transistor structure may be obtained, for example, by providing in the prolonged portion 96*c*, opposite each other, two layers 102*c*, 103*c* of opposite conductivity type with contacts 91*c*, 93*c* by diffusion and/or alloying.

According to a further, particularly suitable embodiment of the invention the circuit diagram of FIG. 9*a* in a semi-conductor device according to the invention may be obtained in that, as is illustrated by way of example in FIG. 9*d* in a diagrammatic sectional view, a region 96*d* prolonged via a practically non-blocking auxiliary pn-junction 98*d* is separated by a further, partly transverse pn-junction 104*d*, intersecting two different faces of this prolonged portion from a prolonged further portion 103*d*, while one of these prolonged portions 96*d* constitutes, by a local deflection of the further pn-junction 104*d* on the other prolonged portion 103*d* a further overlapping zone 95*d*, which contains the active intermediate layer 95*d* of a further transistor structure having the same conductivity structure. The two transistor structures, one of which is formed by an emitter electrode 100*d*, 90*d*, a base layer 101*d*, a base contact 92*d* and a collector layer 99*d* and the other by emitter electrodes 91*d*, 102*d*, a base layer 95*d*, a collector layer 103*d* and a collector contact 93*d*, may therefore be constructed in the body in a similar manner and may be manufactured advantageously at the same time and, if desired, in a completely similar manner, in a starting body having three transverse pn-junctions, for example by using an alloy-diffusion process.

As is shown in FIGS. 9*b*, 9*c* and 9*d* the collector layer 99*b*, 99*c* and 99*d* respectively of one transistor and the active intermediate layer 95*b*, 95*c* and 95*d* respectively of the other transistor are interconnected in the body in a practically ohmic manner and provided with a common connecting contact 94*b*, 94*c*, 94*d* respectively.

Figure 10A:
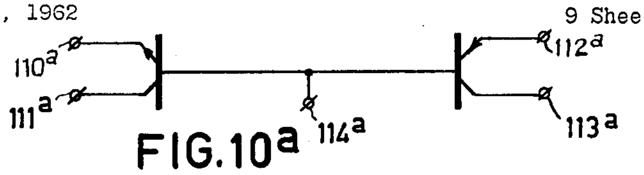

FIG. 10*a* shows a circuit diagram having two transistors of different conductivity type, in which for example one transistor is of the npn-type with an emitter connection 110*a* and a collector connection 111*a* and the other transistor of the pnp-type with an emitter connection 112*a* and a collector connection 113*a*, whereas the base layers of the two transistors have a common base connection 114*a*. Such a circuit arrangement of two transistors of opposite conductivity structure is known per se and may be employed inter alia in push-pull amplifiers having a uniphase input in common-emitter connection.

Figure 10B:
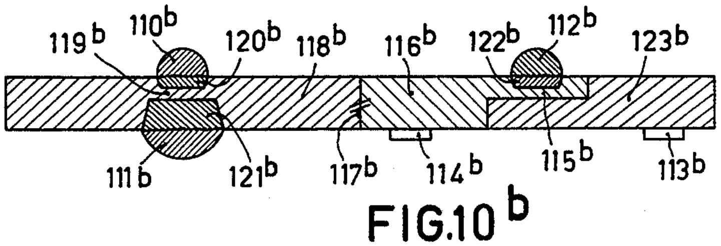
Figure 10C:
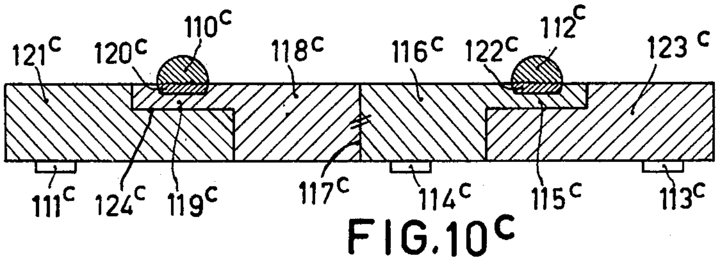

According to a particularly suitable embodiment of the invention the circuit arrangement of FIG. 10*a* in a semi-conductor device according to the invention may be obtained in that, as is illustrated by way of example in FIGS. 10*b* and 10*c* in a diagrammatic sectional view, the one region 116*b*, 116*c* respectively of a transistor structure, forming the overlapping zone (115*b*, 115*c*, respectively) is prolonged via a practically non-blocking auxiliary pn-junction (117*b*, 117*c* respectively) in a portion (118*b*, 118*c* respectively) of opposite conductivity type, which comprises the active intermediate layer (119*b*, 119*c* respectively) of a further transistor structure of opposite conductivity type. It will be seen, for example, from FIG. 10*b* that the construction of the further transistor structure, formed by an emitter contact 110*b*, an emitter layer 120*b*, a base layer 119*b*, a collector layer 121*b* with a collector contact 111*b* may differ from that of the first-mentioned transistor structure formed by an emitter electrode 112*b*, 122*b*, a base layer 115*b*, a collector layer 123*b* and a collector contact 113*b*. The emitter electrode 110*b*, 120*b* and the collector electrode 111*b*, 121*b* may be obtained, for example, by alloying a donor-containing electrode material. If the overlapping zone 115*b* and the emitter electrode 112*b*, 122*b* are obtained by alloy-diffusion, whilst use is made of a predominantly diffusing impurity of one type, for example a donor and of a predominantly segregating impurity of opposite type, the electrodes of the other transistor may advantageously be manufactured simultaneously by alloying an electrode material containing an impurity of the same type as, preferably the same impurity as that used for the diffusion of the overlapping zone 115*b*. With a further, efficacious embodiment of a semi-conductor device corresponding to the circuit diagram of FIG. 10*a*, as is illustrated by way of example in FIG. 10*c* in a diagrammatic sectional view, the portion 118*c* prolonged via a practically non-blocking auxiliary pn-junction 117*c* in the one region 116*c* forming the overlapping zone 115*c* is separated by a further, partly transverse pn-junction 124*c* intersecting two different faces of this prolonged portion from a prolonged further portion 121*c*, whilst the first-mentioned prolonged portion 118*c* forms, by deflection of the said further pn-junction 124*c* on the last-mentioned prolonged further portion 121*c*, a further overlapping zone 119*c*, which comprises the active intermediate layer 119*c* of a further transistor structure of opposite conductivity structure. The two transistor structures, one of which is formed by the emitter electrode 110*c*, 120*c* the base layer 119*c*, the collector layer 121*c* and the collector contact 111*c* and the other is formed by the emitter electrode 112*c*, 122*c*, the base layer 115*c*, the collector layer 123*c* and the collector contact 113*c*, are therefore constructed in a similar manner on portions of opposite conductivity type and may, for example, be manufactured separately, for example by epitaxial growth or by diffusion of the overlapping zones and alloying of the emitter electrodes.

In FIGS. 10*b* and 10*c* the contact 114*b*, 114*c* respectively form a common connection for the intermediate layers 119*b*, 115*b* and 119*c*, 115*c*, which are practically ohmically connected to each other in the body.

Figure 11A:
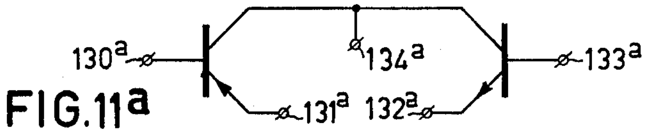

FIG. 11*a* shows a circuit diagram having two transistors of different conductivity structure, in which preferably one transistor is of the pnp-type having a base connection 130*a*, an emitter connection 131*a*, and the other transistor is of the npn-type having an emitter connection 132*a*, and a base connection 133*a*, whilst the collector layers of the two transistors have a common collector connection 134*a*. Such an arrangement of two transistors is known per se and is employed inter alia in push-pull amplifiers with a uniphase input in common collector connection.

Figure 11B:
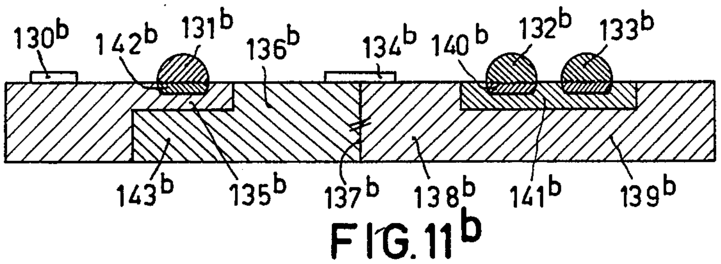
Figure 11C:
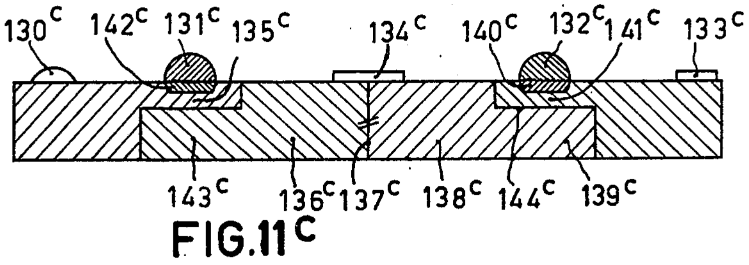

The circuit diagram shown in FIG. 11*a* may be obtained in a semi-conductor device according to the invention in that, as is illustrated by way of example in FIGS. 11*b* and 11*c* in a diagrammatic sectional view, the other region (136*b*, 136*c* respectively) of a transistor structure, supporting the overlapping zone (135*b*, 135*c* respectively) is prolonged via a practically non-blocking auxiliary pn-junction (137*b*, 137*c* respectively) in a portion (138*b*, 138*c* respectively) of opposite conductivity type, which forms the collector layer of a further transistor structure of different conductivity structure. From FIG. 11*b* it will be seen that the construction of the further transistor structure formed by emitter electrodes 132*b*, 140*b*, a base layer 141*b*, a base contact 133*b*, a collector layer 139*b* may differ from that of the first-mentioned transistor structure formed by emitter electrodes 131*b*, 142*b*, a base layer 135*b*, a base contact 130*b* and a collector layer 143*b*. The further transistor structure may be provided separately in the body by diffusion of the base layer 141*b* or by epitaxial growth from the vapour phase thereof and by subsequently or (in the case of diffusion) simultaneously alloying the electrodes 132*b* and 133*b*.

With a further suitable embodiment of an arrangement as shown in FIG. 11*a*, comprising a semi-conductor device according to the invention, as will be seen from FIG. 11*c* in the diagrammatical sectional view, a part 138*c* of the other region 143*c*, supporting the overlapping zone 135*c*, which part is prolonged via a practically non-blocking auxiliary pn-junction 137*c*, is separated by a further, partly transverse pn-junction 144*c* intersecting two different faces of this prolonged part, from a further prolonged part 141*c*, which prolonged further part 141*c* forms by deflection of the said further pn-junction 144*c* on the first-mentioned prolonged part 138*c* on overlapping zone 141*c*, which comprises the active intermediate layer 141*c* of a further transistor structure of different conductivity structure. The two transistor structures are therefore constructed similarly, but they have opposite conductivity structures, whilst one transistor is formed by emitter electrodes 131*c*, 142*c*, a base layer 135*c*, a base contact 130*c* and a collector layer 143*c* and the other is formed by emitter electrodes 132*c*, 140*c*, a base layer 141*c*, a base contact 133*c*, and a collector layer 139*c*. The portion separated by the auxiliary pn-junction 137*c* may be produced separately and in advance and if desired, they may be interconnected subsequently by the addition of a thin layer of low-melting-point binder, whilst heated.

As is shown in FIGS. 11*b* and 11*c* the collector layers 139*b*, 143*b* and 139*c*, 143*c* respectively are practically ohmically interconnected in the semi-conductor body and provided with a common collector contact 134*b*, 134*c* respectively.

In connection with the figures described above, it should be noted that, although they refer to an arrangement of two transistors, it is also possible to arrange more than two transistors in the same manner by arranging more than two transistors side by side on the body concerned, if desired subsequent to a separation of the body portion concerned by means of intersections. Moreover, these semi-conductor devices may form part of a larger semi-conductor device in which the various regions of the transistors comprise further circuit elements or in which two or more of these semi-conductor devices are incorporated, if desired with further circuit elements. The latter applies in particular to those semi-conductor devices in which also the further transistor structure is constructed in a similar manner as the first transistor structure, since in this case also the further transistor structure is amply accessible for connections to further circuit elements. Although in FIGS. 5*c*, 6*c*, 7*c*, 9*c*, 10*c* and 11*c* the two overlapping zones are each time located on the same side of the body, the some advantageous result is obtained by causing one pn-junction to form the overlapping zone on one side of the body and the other pn-junction by deflection to form the other overlapping zone on the other side of the body. A reaction between the effects of one transistor structure and that of the other transistor structure or of a further circuit element can be avoided by arranging the active parts at an adequate distance from each other in the body, for example at a distance exceeding one diffusion length preferably three diffusion lengths or by arranging them so that the minority charge carriers of one element can practically not reach the other element.

In the embodiments of a semi-conductor device according to the invention described above one of the regions separated by the pn-junction forms one or more overlapping zones on the other region. With a further suitable embodiment of a semi-conductor device according to the invention as is shown in FIG. 12 in a diagrammatic sectional view, one region 146 forms, by deflection 147 of a partly transverse pn-junction 148 near one face of the body an overlapping zone 149 on the other region 150, whilst on the same face or on the opposite face by a further deflection 151 of the same pn-junction 148 the other region 150 forms a further overlapping zone 152 on the one region 146. One overlapping zone 149 of one conductivity type comprises an active intermmediate layer of a transistor of one conductivity structure, for example pnp, whereas the other overlapping zone 152 of the other conductivity type comprises an active intermediate layer of a transistor structure of opposite conductivity structure, for example npn. The one transistor structure is formed by emitter electrodes 153, 154, base layers 149, 146, with a base contact 155, and collector layers 150, 152 with a collector contact 156 and the other transistor structure is formed by emitter electrodes 157, 158, base layers 152, 150 with a base contact 156, collector layers 146, 149, with a collector contact 155. This semi-conductor device according to the invention comprises therefore two transistors of opposite conductivity structure in one arrangement, in which the base and collector of one transistor is connected to the collector and the base respectively of the other transistor. Such an arrangement with two separate transistors is, as is known, suitable inter alia for use as an electronic switch with thyratron effect. The invention provides also in this case an efficacious assembly.

The plate-shaped part of a semi-conductor body comprising a semi-conductor device according to the invention may form part of a larger semi-conductor body having, as a whole, a different shape. Like the auxiliary pn-junctions and the partly transverse pn-junctions provided therein, the body is not bound to a given shape. The plate-shaped part may, for example, be partly shaped in the form of a ring having one or more pn-junctions in order of succession around the ring. With a preferred embodiment of a semi-conductor device according to the invention with more than one of such pn-junctions, as is shown in a plan view in FIG. 13 and in a sectional view in FIG. 14, the semi-conductor body consists at least partly of an elongated, substantially rectilinear, flat strip 160 in which at least two junctions of the group formed by said auxiliary pn-junctions 161, 162 and by the transverse parts 163, 164 of the said partly transverse pn-junctions extend parallel to each other and transversely to the longitudinal direction of the strip. Such a construction has the advantages that it is systematic and can be readily manufactured by sawing the starting body with the consecutive pn-junctions from a monocrystalline bar obtained for example by drawing from a melt and having a plurality of consecutive pn-junctions in the longitudinal direction of the bar.

In a preferred embodiment of a semi-conductor device according to the invention having more than one of the said pn-junctions, as is illustrated in FIGS. 15 and 16 by way of example in a plan view of a circuit arrangement differing only with respect to the shape of the body and the disposition of the pn-junctions from that of FIGS. 13 and 14, at least two of group of junctions formed by the available auxiliary pn-junctions 161, 162 and by the transverse parts 163, 164 of the available, partly transverse pn-junctions are located in a common flat face or plane (FIG. 15: 161, 163, 162, 164) or in a common circular-cylindrical face or plane (FIG. 16: 161, 163, 162, 164), while these pn-junctions are separated from each other by recesses 165, the portions of opposite conductivity type separated by these pn-junctions being in a consecutive, staggered position in the body. In FIGS. 13 to 16 corresponding parts are designated by the same reference numeral. The dispositions shown in FIGS. 15 and 16 have both the advantage that they are systematic and permit of restricting the number of pn-junctions in the starting bar, from which the body is made, by providing recesses in the body and, if desired, of avoiding the elongated shapes of FIGS. 13 and 14. The arrangement shown in FIG. 15 can be manufactured in a simple manner by cutting a wafer from a starting bar having a pn-junction and by subsequently providing the recesses therein. The arrangement shown in FIG. 16 is constructed on a disc having a circular-cylindrical pn-junction, which disc can be sawed from a bar having a concentric pn-junction. Such a bar having a concentric pn-junction may be obtained in a simple manner, for example, by causing, in known manner with floating zone melting of, for example, a p-conductive bar, the molten zone to pentrate only partly into the bar by controlling the supply of heat and by converting the molten, annular zone into p-conductive material by the addition of an acceptor. Although with the semi-conductor devices shown in FIGS. 15 and 16 all available pn-junctions 161, 162, 163, 164 are located in the same common surface, it may be useful in certain cases to combine these dispositions with those shown in FIGS. 13 and 14 by providing between two consecutive recesses 165 instead of one pn-junction several, parallel pn-junctions in order of succession before the structure is prolonged between the next-following pair of recesses.

With reference to FIGS. 13 to 18 particularly the semi-conductor devices of FIGS. 9*b* and 9*d* and further particular embodiments thereof, as well as their manufacture will now be described more fullv.

FIG. 17 shows the essential part of a circuit diagram of a conventional transistor amplifier equipped with three transistors, for example of the pnp-type, connected in direct-voltage cascade; this amplifier is suitable for use, for example, in a hearing aid apparatus. The base connection 166 and the emitter connection 167 constitute the input of the amplifier. The emitter connections 167, 168 and 169 are connected to each other and provided with a common contact 179. On the one hand the collectors 170 and 171 are connected to the base of the next-following transistors 173 and 174 respectively and the collector 172 constitutes an output of the amplifier, on the other hand the three collectors 170, 171 and 172 are connected each to a resistor 175, 176 and 177 respectively, these resistors 175, 176 and 177 being connected to the common connection 178. The amplified signal may be derived for example between the connections 178 and 172.

FIGS. 13, 15 and 16 show in a plan view three different embodiments of a semi-conductor device according to the invention, in which this circuit diagram with the exception of the resistors 175, 176 and 177 is employed. FIG. 14 shows a longitudinal sectional view of the semi-conductor device of FIG. 13 on the broken line XIV—XIV. In these FIGURES 13 to 16 parts corresponding with the circuit diagram of FIG. 17 are designated by the same reference numerals. Since the three embodiments of FIGS. 13, 15 and 16 differ only with respect to the shape of the body and the relative geometric disposition of the pn-junctions 161, 162, 163 and 164, no further sectional views of the semi-conductor devices of FIGS. 15 and 16 are shown, since they may be derived from FIG. 14, which may, in addition, be regarded as being a sectional view of the body of FIG. 15 on the broken line 181 and as a sectional view of the body of FIG. 16 on the broken line 182.

From these FIGS. 13 to 16 and particularly from the sectional view of FIG. 14 it will be seen that the part of the body lying on the left-hand side of the auxiliary pn-junction 162 corresponds in its construction with the semi-conductor device of FIG. 9*b*. The one region 173, forming the overlapping zone 183 and being the base layer of a pnp-transistor, is prolonged via the practically non-blocking auxiliary pn-junction 161 in a p-conductive part 184, which forms at least partly the collector zone of a further pnp-transistor having a base contact 166, an emitter contact 167 and a base layer 185. The part of the body lying on the right-hand side of the auxiliary pn-junction 161 corresponds in its structure with the semiconductor device of FIG. *9d*. The n-conductive part 174, prolonged via the practically non-blocking junction 162, is separated by a further pn-junction 164 from a prolonged further p-conductive part 186, the part 174 forming, on the part 186, an n-conductive overlapping zone 187, which comprises the active base layer of a pnp-transistor having an emitter contact 169. On the bottom side of the plate-shaped bodies, as appears from FIG. 14, the collector contacts 170, 171 and 172 are available for connection to the resistors 176, 175 and 177. The emitter contacts are interconnected via supply conductors 179.

FIG. 18 shows a further developed embodiment of a semi-conductor device comprising the circuit diagram of FIG. 17 in a plan view. This embodiment differs only from that of FIG. 15 in that it comprises, in addition, the resistors formed by prolonged portions 175, 176 and 177, which are interconnected in the body in an ohmic manner on the sides remote from the pn-junctions 161, 162, 163 and 164. The resistor 176 is formed by the two central, continuous parts 176. Since the resistors 175 and 176 and 177 are incorporated in the body, the separate collector contacts 170, 171, and 172 (see FIG. 14) may be omitted. In a similar manner the resistors 175 and 176 and 177 in the arrangements of FIGS. 13 and 16 may be provided by providing the parts of the body adjacent the collector layers with projecting parts forming these resistors. The same may be carried out, if desired, in the configuration shown in FIG. *9c*.

It may of course in some cases be desired and advantageous to increase locally the resistivity of the body at these portions, which constitute the resistance elements, and connect these portions by means of a lower resistivity portion to a further circuit element, for instance the collector junction of a transistor.

With a further embodiment of a semi-conductor device according to the invention, as is shown by way of example in FIGS. *9b*, *9c* and *9d*, at least one, preferably all parts of the body adjacent a collector layer are therefore provided advantageously with a further, prolonged part which forms a resistance element. To this end the connecting contact is secured to the end of the projecting part remote from the collector junction. With such a semi-conductor device in which at least two resistance elements formed by prolonged parts are available, the ends remote from the collector junction are preferably connected in the body to each other and provided with a common connection. From FIG. 17 it appears furthermore that the invention permits of obtaining circuit arrangements in a semi-conductor device by means of very few parts to be connected by external supply conductors, which may also be considered as a great advantage.

For a further explanation of the method according to the invention a method of manufacturing the semi-conductor device of FIG. 18 will now be described by way of example in detail. The same method may be carried out with advantage, if necessary subsequent to minor modifications, for the manufacture of the other embodiments. By drawing a monocrystalline from a germanium melt seed a monocrystalline bar is made from a melt in a conventional manner, which bar is p-conductive over part of its length by the addition of indium, the resistivity being about 10 ohm-cm., the remainder of the length being n-conductive and having a resistivity of about 0.5 ohm-cm. by the addition of antimony. By sawing parallel to the longitudinal axis wafers are formed from this bar. One of these wafers is immersed into a copper-sulphate solution in order to render the pn-junction visible, copper being deposited only on the p-conductive part. Then a plate-shaped body of the shape of FIG. 18 is made from this wafer by sawing. The height of the plate is about 8 mms. and the width about 5 mms. The pn-junction is located at a distance of about 1.5 mms. from the lower edge. The lower part consists of n-conductive material and the upper part of p-conductive material. The recesses 165 and 180 are provided by supersonic boring. The recesses 165 have a width of about 0.3 mm. and extend up to a distance of 1.5 mms. from the upper side while on the other side they pass by the pn-junction at a distance of about 0.2 mm. The recess 180 has a width of about 1.1 mms. and approaches the pn-junction 162, 163 up to a distance of about 1.5 mms. The copper is then removed in a diluted $HNO_3$ solution and the plate is etched to a thickness of about $150\mu$ in a chemical etching bath containing 14 cc. of HF (38%), 10 cc. of $HNO_3$ (60%) and 1 cc. of alcohol.

At the contact places designated in FIG. 18 by 166, 167, 168 and 169 pellets of lead with about 2% by weight of Sb, having a diameter of about $250\mu$ are arranged and locally stuck by a transient heating process at 600° C. The pellets 167, 168 and 169, intended for the emitter electrodes, are provided with a small quantity of aluminum containing paint by paint-brushing. U.S. applications, Serial Nos. 676,562 and 785,825, filed, respectively, August 6, 1957, and January 9, 1959, and U.S.P. 2,964,430 describe this process in more detail, whose disclosures are hereby incorporated by reference. The assembly is then heated in a furnace at about 800° C. for about 15 minutes for carrying out the alloy-diffusion process. Thus the melts formed by the pellets 166, 167, 168 and 169, as may be seen from FIG. 14, penetrate into the body, thus forming the melt fronts 188, 189, 190 and 191 respectively. Beneath these melt fronts, owing to the predominant diffusion of the antimony, the n-conductive zones are formed, while at the same time by surface diffusion and evaporation of antimony from the melts also the surfaces of the adjacent body portions are provided with an adjacent n-conductive layer having a smaller depth of penetration, covering both the p-conductive surface and the n-conductive surface. Upon cooling the recrystallisation deposits p-conductive layers from the melt with the pellets 167, 168 and 169, intended for the emitter, owing to the predominant segregation of the aluminum on the n-type diffused layer, while subsequently the contacts 167, 168 and 169 consisting mainly of lead are deposited thereon. From the melt 166, intended for the base contact, an ohmic contact is formed on the diffused layer owing to the absence of aluminum.

In order to remove the superfluous parts of the n-conductive layer a conventional etching process may be carried out. To this end the body may be masked by wax or lacquer at the place of the base layer 185 between the two contacts 166 and 167 on the parts 183 and 187, intended for the overlapping zones and on the initial, already n-conductive faces 173 and 174 adjacent the overlapping zones 183 and 187 and, if necessary on the contacts and subsequently immersed, for example in the aforesaid etching bath, for about one minute. After the resist layer is removed, scratches are made by means of a diamond pin on the pn-junctions 161 and 162 both on the upper side and on the bottom side of the plate, so that these junctions are rendered practically non-blocking. Subsequently, by means of indium solder, two nickel strips 178 and 172 are soldered to the bottom side, after which by means of lead-tin solder the nickel supply conductors 179 are fastened to the contacts 166, 167, 168 and 169. After a short after-treatment by etching in a $H_2O_2$ solution, rinsing in deionized water and drying the assembly is ready for mounting in an envelope.

By way of example it will now be explained with reference to FIGS. 19 to 24 that the invention offers further particular possibilities to unite other further circuit elements in a semi-conductor body with a transistor in an efficacious manner instead of one or more further transistor structures.

FIG. 19 shows a circuit diagram of a so-called inverter arrangement of conventional structure, which is frequently employed inter alia in computers and serves for phase inversion and amplification of a pulse, for example for converting a positive pulse into an amplified negative pulse. The input is formed by the terminal 200 and the emitter connection 202 of a pnp-transistor. The output is formed by a collector connection 203 and an emitter connection 202. Apart from the resistor 204 of, for example, 600 ohms, a Zener diode 207 is included in the base circuit between the terminals 205 and 206. A conventional diode 208 is connected between the base connection 206 and the collector connection 203 via the Zener diode 207 in order to avoid that the collector should be driven in the forward direction during operation. The Zener diode 207 and/or the diode 208 may if desired be omitted, if the said precautions are not required. There is furthermore provided a resistor 209 for supplying the correct bias voltage to the base.

FIGS. 20 to 22 show diagramatically sectional views of these different embodiments of a semi-conductor device according to the invention, in which the circuit diagram of FIG. 19 is partly used, while FIGS. 23 and 24 show in a sectional view and in a plan view two embodiments in which the circuit diagram as a whole is employed. In these FIGURES 20 to 24 parts corresponding with those of the circuit diagram of FIG. 19 are designated by the same reference numerals.

From FIG. 20 it may be seen that the transistor and the resistor 209 are united in the semi-conductor body in an efficacious manner in that, in accordance with the invention, the one region 212 forming the, for example n-conductive overlapping zone 211 has, apart from an ohmic base 206 a further continuous part 209, which forms a resistance 209 and is provided with an ohmic contact at the end of the continuous part 210. The p-conductive emitter layer 213 and the collector layer 214 are provided with an emitter contact 202 and the collector contact 203 respectively.

In a further embodiment of a semi-conductor device according to the invention a Zener diode 207 can be united in an efficient manner with a transistor by, as will be seen for example from FIG. 21, providing a part 215 of opposite conductivity type, forming part of the Zener diode having a contact 205 on the one region 212 forming the overlapping zone. The region 212 constitutes the other layer of the Zener diode and the latter layer is thus automatically connected in the body to the base layer of the transistor. In order to obtain the desired value of the break-down voltage of the Zener diode, the resistivity of the layer 215, which may be the recrystallized p-conductive region of an alloy electrode with the contact 205, and of the one region may be chosen adequately low. With a further preferred embodiment the said layer 215 is provided on a zone 216 of lower resistivity, which terminates in the overlapping zone 211. By way of example FIG. 21 shows the boundary of the zone 216 by broken lines 217. The resistivity of the region 212 may be chosen arbitrarily higher, for example in order to obtain at the same time the resistance 209 in the body. The resistance 209 with the contact 210 may be omitted and be connected externally to an ohmic base contact 206 to be provided in addition.

From FIG. 22 it will be seen that an efficient assembly of the diode 208 and the transistor may be obtained if, in accordance with the invention, the other region 214, supporting the overlapping zone comprises two parts of opposite conductivity type, for example the p-conductive region 214 and the n-conductive region 218, separated by the pn-junction 208 of the diode. On the n-conductive region 214 provision is made of an ohmic contact 219. From FIG. 22, in which the construction of the semi-conductor body is similar to that of FIG. 21, it appears furthermore that, if desired simultaneously the Zener diode 205, 215, 216 and/or the resistance 209 can be incorporated in the semi-conductor body.

From FIGS. 23 and 24 it will be seen that in a further embodiment of the invention the diode 208 and the resistance 204 can be united efficiently with the transistor by joining a further prolonged portion 204 to the part 218, remote from the partly transverse pn-junction 220, the portion 204 being provided at the end with a contact for example a contact strip 200. From FIGS. 23 and 24 it will further appear that the contact 205 on the layer 215 forming part of the Zener diode may be connected by means of an external supply conductor 221 to a contact 219 on the body at a connecting area between the diode junction 208 and the resistance element 204 in order to complete the circuit diagram shown in FIG. 19. FIG. 23 is otherwise similar to FIG. 22. The resistance element 209 and/or the Zener diode 207 may, if desired, be used separately from the semi conductor body.

Whereas the embodiment shown in FIG. 23 consists of a flat, rectilinear strip, the semi-conductor body, as is shown in FIG. 24 in a plan view may be formed by a two-legged, curved strip, in order to obtain a compact structure, whilst the transverse portion of the partly transverse pn-junction 220 is located in one limb 209 and is coplanar to the pn-junction 208 in the other limb 204 of the diode. Otherwise the embodiment shown in FIG. 24 is similar to that of FIG. 23, so that the latter figure may be considered as a sectional view of FIG. 24 on the broken line 224.

With the manufacture of the embodiment shown in FIG. 24 it is advantageous to carry out an alloy-diffusion process with a starting body having a pn-junction grown from the vapour or melt, which will now be described in detail.

By the combination of drawing from a melt, sawing and ultrasonic boring, a semi-conductor starting body is manufactured in the manner described with reference to FIG. 18, this body having the shape shown in FIG. 24 and having a completely transverse pn-junction and a pn-junction 208. The parts of the body lying beneath the pn-junctions 220 and 208 consist of n-conductive germanium, having a resistivity of about 10 ohm-cm. and a part 214, lying above the pn-junctions 220 and 208 consists of p-conductive germanium having a resistivity of about 1 ohm-cm. The height and the width of the long limb 209 up to the pn-junction 220 are about 5.5 mms. and 1 mm. respectively and the height and the width of the short limb 204 up to the pn-junction 208 are both about 2 mms. The width of the recess 222 is about 1 mm. and this recess passes by the face of the plane of the pn-junctions 220 and 208 at a distance of about 0.5 mm. The distance of the plane of these pn-junctions 220 and 208 from the upper side of the strip is about 2.5 mms. After the starting body has been etched in the manner described to a thickness of about $150\mu$, the contact places intended for the contacts 210, 205, 202 and 219 are provided with pellets of Pb with 2% by weight of Sb and having a diameter of about $250\mu$, and stuck thereto by a transient heating at 600° C. Then a small quantity of aluminum-containing paint is brushed onto the pellets intended for the Zener diode contact 205 and the emitter electrode contact 202. The assembly is heated in a furnace at about 800° C. for about 15 minutes. Thus the diffusion of the antimony forms below the melt fronts of the pellets 210, 205, 202, 219 in the underlying n-conductive germanium zones having increased donor concentrations, which provide beneath the contacts 210 and 219 low-ohmic connections to the body and beneath the melt front of the Zener diode contact 205 to the zone (216 see FIG. 23) of lower resistivity. Beneath the melt front of the pellet intended for the emitter electrode 202 the antimony diffusion forms the n-conductive active part 211 of the base zone in the underlying p-germanium. At the same time an adjacent n-conductive layer is formed in the face of the body portions adjacent the contacts 210, 205, 202, 219 practically throughout the body surface by the antimony evaporated from the pellets or by antimony diffused along the surface. It is, of course, possible to add antimony to the atmosphere or to provide a layer prediffused by antimony.

Upon cooling owing to the predominant segregation of the aluminum p-conductive zones are deposited by recrystallization from the melt at the pellets intended for the Zener diode 205 and the emitter electrode 202 on the n-type diffused zones, after which the remainder of the pellets consisting mainly of lead are separated out as contacts 202 and 205. Owing to the absence of aluminum a n-type recrystallized layer and a metal rest to be used as a contact are formed from the pellets intended for the ohmic contacts 210 and 219.

In order to remove the superfluous parts of the n-conductive layer of the body is masked by wax at the area of the overlapping zone 223, inside the surface bounded by the broken line 217 at the Zener diode contact 205 and if necessary on and in the proximity of the contacts, after which it is etched in the manner described with reference to FIG. 18. Finally, after the wax is removed, an indium electrode (203, see FIG. 23) is alloyed opposite the emitter contact 202 onto the lower side of the strip and by means of lead-tin solder the nickel strip 200 is fastened. In a conventional manner a nickel supply conductor 221 is secured to the contacts 205 and 219. As an alternative, the supply conductors and the electrodes concerned may be provided prior to the etching treatment. After a similar transient etching treatment in a $H_2O_2$-solution, rinsing and drying, the assembly is ready for mounting in an envelope.

It should be noted that the invention is not restricted to the embodiments described above and that within the scope of the invention those skilled in the art may apply many modifications. For example, other semi-conductor materials than germanium may be used in a similar manner, for example silicon or gallium arsenide. The conductivity type of the various parts of the device described may furthermore be inverted without modifying the nature of the structure. It is furthermore obvious that the measures described with respect to the inverter arrangement may be applied separately or in conjunction to semi-conductor devices having circuit diagrams intended for a different purpose but partly corresponding to those of the devices described. Moreover, with respect to the manufacture many variations are allowed, for example in removing layers of a semi-conductor body, to which end, for example other etchants or resist layer techniques may be employed. It will be noted that an important advantage of the structure of the invention is that the bulk portions of the semi-conductor body constitute interconnections between active and/or inactive components built up on the body itself. These body interconnections are of good quality and are reliable. Thus, less external leads or metallized strips are needed, which are cumbersome to provide or possibly introduce additional sources of trouble during the manufacture. The inventive method is especially attractive when employing the alloy-diffusion process described in the aforementioned patent and copending U.S. applications, since a prediffused surface layer or impurities volatilized from the pellets or added during the process from the ambient can be used automatically to form the overlapped zone integral with the adjacent zone.

What is claimed is:

1. A semi-conductor device including at least one transistor structure of at least three layers of alternating one and opposite conductivity type, comprising a wafer-shaped body of semi-conductive material having one and opposite major surfaces extending substantially in the same direction as its longitudinal direction and comprising at least first and second longitudinally-spaced regions of opposite conductivity type completely separated by a p-n junction having a first portion extending transversely to the wafer-shaped body over most of its thickness to and intersecting one major surface and having a second portion near the opposite major surface extending in the longitudinal direction of the wafer and to and intersecting the opposite major surface, said longitudinally-extending junction portion defining an overlapping surface zone integral with the first region and of the same conductivity type extending over the second region of the opposite conductivity type, said first and second longitudinally-spaced regions both extending to and being accessible at both the one and the opposite major surfaces, a third layer region of said opposite conductivity type located in the overlapping zone adjacent said opposite major surface and spaced from the second region such that the entire part of said first region between the third region and the second region and constituting an active part of said first region is located in the overlapping zone, said active part of said first region constituting a center region of said three layer transistor, the third region constituting an outer layer of said transistor, the second region constituting the other outer layer of said transistor, connections to exposed surfaces of said first, second and third regions to form at least one transistor structure, and a fourth region located outside of that portion of the body in and underlying said overlapping surface zone, said fourth region being crystallographically interconnected to one of said first and second regions and forming a rectifying junction therewith, and at least a part of a second electrical component formed in said fourth region.

2. A semi-conductor device as set forth in claim 1 wherein the second electrical component is a second transistor with emitter, base and collector regions, and said one of said first and second regions of the body constitutes an internal ohmic connection between said one and said second transistors to form at least part of a unitary electronic circuit.

3. A semi-conductor device as set forth in claim 1 wherein a third electrical component is formed in the other of said first and second regions and is internally connected to said one transistor.

4. A semi-conductor device as set forth in claim 2 wherein said active part of said first region constitutes a first transistor base region, said third region constitutes a first transistor emitter region, said second region constitutes a first transistor collector region, and said internal ohmic connection is between one of the first transistor base and collector regions and one of the base and collector regions of the second transistor.

5. A semiconductor device as set forth in claim 4 wherein the first region internally connects the first transistor base region to the base region of the second transistor, said second transistor having the same conductivity as that of the said one transistor.

6. A semiconductor device as set forth in claim 4 wherein the first region internally connects the first transistor base region to the collector region of the second transistor, said second transistor having the opposite conductivity as that of the first transistor.

7. A semiconductor device as set forth in claim 4 wherein the first region internally connects the first transistor base region to the base region of the second transistor, said second transistor having the opposite conductivity as that of the first transistor.

8. A semiconductor device as set forth in claim 4 wherein the first region internally connects the first transistor base region to the collector region of the second transistor, said second transistor having the same conductivity as that of the first transistor.

9. A semiconductor device as set forth in claim 4 wherein the second region internally connects the first transistor collector region to the collector region of the second transistor.

10. A semiconductor device including at least one transistor structure, comprising a wafer-shaped body of semiconductive material having one and opposite major surfaces extending substantially in the same direction as its longitudinal direction and comprising at least first and second longitudinally-spaced regions of opposite conductivity type completely separated by a p-n junction having a first portion extending transversely to the wafer-shaped body over most of its thickness to and intersecting one major surface and having a second portion near the opposite major surface extending in the longitudinal direction of the wafer and to and intersecting the opposite major surface, said longitudinally-extending junction portion defining an overlapping surface zone integral with the first region and of the same conductivity type extending over the second region of the opposite conductivity type, said first and second longitudinally-spaced regions both extending to and being accessible at both the one and the opposite major surfaces, a third region of said opposite conductivity type located in the overlapping zone adjacent said opposite major surface and spaced from the second region such that the entire portion of said first region lying between the third region and the second region and constituting an active part of said first region is located in the overlapping zone, said active part of said first region constituting the transistor base region, connections to exposed surfaces of said first, second and third regions to form at least one transistor structure, a fourth region of said body integral with one of said first and second regions and of the opposite conductivity type to said one of said first and second regions and separated therefrom by a substantially short-circuited p-n junction, and a further circuit element connected with said fourth body region.

11. A semiconductor device as set forth in claim 10 wherein the further circuit element is a second transistor, and the fourth region internally connects the base region of the first transistor to the collector region of the second transistor, said second transistor being of the same conductivity type as that of the first transistor.

12. A semiconductor device as set forth in claim 10 wherein the further circuit element is a second transistor, and the fourth region internally connects the base region of the first transistor to the base region of the second transistor, said second transistor being of the same conductivity type as that of the first transistor.

13. A semiconductor device as set forth in claim 10 wherein the further circuit element is a second transistor, and the fourth region internally connects the base region of the first transistor to the base region of the second transistor, said second transistor being of the opposite conductivity type as that of the first transistor.

14. A semiconductor device as set forth in claim 10 wherein the further circuit element is a second transistor, and the fourth region internally connects the base region of the first transistor to the collector region of the second transistor, said second transistor being of the opposite conductivity type as that of the first transistor.

15. A semiconductor network including at least one transistor structure, comprising a wafer-shaped body of semiconductive material having one and opposite major surfaces extending substantially in the same direction as its longitudinal direction and comprising at least first and second longitudinally-spaced regions of opposite conductivity type completely separated by a first p-n junction having a first portion extending transversely to the wafer-shaped body over most of its thickness and intersecting one major surface and having a second portion near the opposite major surface extending in the longitudinal direction of the wafer and to and intersecting the opposite major surface, said longitudinally-extending junction portion defining an overlapping surface zone integral with the first region and of the same conductivity type extending over the second region of the opposite conductivity type, said first and second longitudinally-spaced regions both extending to and being accessible at both the one and the opposite major surfaces, a third region of said opposite conductivity type located in the overlapping zone adjacent said opposite major surface and spaced from the second region such that the entire part of said first region lying between the third region and the second region and constituting an active part of said first region is located in the overlapping zone, said active part of said first region constituting the transistor base region, connections to exposed surfaces of said first, second and third regions to form at least one transistor structure constituting a first active element, and a second active element including a second p-n junction on one of the first and second regions, portions of the body physically and electrically interconnecting active regions of the transistor structure and of the second active element, the first and second p-n junctions lying substantially in the same plane but being separated from each other by a recess in the semiconductive body.

16. A network as set forth in claim 15 wherein a third active element is present which also includes a third p-n junction extending in the same plane as the first and second p-n junctions, said first, second and third p-n junctions being separated by recesses in the body extending in an alternating manner from opposite side edges of the wafer.

17. A network as set forth in claim 15 wherein the transistor includes an additional region between the third region and said opposite major surface and of said one conductivity type to form a 4-layer transistor device.

18. A network as set forth in claim 15 wherein the body portion adjacent the third region constitutes a resistance element.

19. A network as set forth in claim 18 wherein several transistors are present each with its own collector region, each body portion adjacent a collector region constitutes a resistance element, and the ends of the resistance elements are connected together.

20. A network as set forth in claim 15 wherein the second region comprises two portions of opposite conductivity type separated by a diode p-n junction.

21. A network as set forth in claim 20 wherein the portion of said two portions separated by a diode p-n junction and remote from the first region is integral with an elongated body portion constituting a resistance element.

22. A network as set forth in claim 21 wherein the wafer has a U-shape with the transistor in one leg of the U and the diode in the other leg.

23. A semiconductor device including plural transistor structures, comprising a wafer-shaped body of semiconductive material having one and opposite major surfaces extending substantially in the same direction as its longitudinal direction and comprising at least first and second longitudinally-spaced regions of opposite conductivity type completely separated by a p-n junction having a first portion extending transversely to the wafer-shaped body over most of its thickness to and intersecting one major surface and having a second portion near the opposite major surface extending in the longitudinal direction of the wafer and to and intersecting the opposite major surface, said longitudinally-extending junction portion defining an overlapping surface zone integral with the first region and of the same conductivity type extending over the second region of the opposite conductivity type, said first and second longitudinally-spaced regions both extending to and being accessible at both the one and the opposite major surfaces, a third region of said opposite conductivity type located in the overlapping zone adjacent said opposite major surface and spaced from the second region such that the entire portion of said first region lying between the third region and the second region and constituting an active part of said first region is located in the overlapping zone, said active part of said first region constituting a first transistor base region, said third region constituting a first transistor emitter region, said second region constituting a first transistor collector region, connections to exposed surfaces of said first, second and third regions to form a first transistor structure, a second transistor structure in at least one of said first and second regions and including second emitter, second base and second collector regions, the one of said first and second regions containing the second transistor being itself divided into parts of opposite conductivity type by a p-n junction having a first transverse portion extending to and intersecting one surface of the body and a second longitudinal portion extending to and intersecting the opposite major surface with the longitudinally-extending portion defining a further overlapping zone integral with said one of said first and second regions and of the same conductivity type and extending over the region of opposite conductivity type, the said parts of opposite conductivity type both extending to and being accessible at both the one and the opposite major surfaces, the base region of said second transistor being located in the last-named overlapping zone, said one of said first and second regions constituting an internal connection between one of the first transistor base and collector regions and one of the second base and collector regions of the second transistor.

24. A semiconductor network including at least one transistor structure of at least three layers of alternating one and opposite conductivity type and a second active element, comprising a wafer-shaped body of semiconductive material having opposed major surfaces extending substantially in the same direction as its longitudinal direction and comprising at least massive first, second and third longitudinally-spaced regions of opposite conductivity type defined by two p-n junctions each having a first portion extending transversely to the wafer-shaped body over substantially the whole of its thickness to and intersecting one major surface and having a second portion closely adjacent the opposite major surface extending in the longitudinal direction of the wafer and to and intersecting the opposite major surface, said longitudinally-extending junction portions each defining an overlapping surface zone integral with one of said first, second and third regions and of the same conductivity type and extending over the adjacent region of the opposite conductivity type, said first, second and third longitudinally-spaced regions each extending to and being accessible at both the one and the opposite major surfaces, a fourth region of said body located in one of the overlapping zones adjacent said opposite major surface and spaced from the said adjacent region such that the entire part of said one region between the fourth region and the adjacent region and constituting an active part of said one region is located in the overlapping zone, said active part of said one region constituting a center region of said three layer transistor, the fourth region constituting an outer layer of said transistor, the adjacent region constituting the other outer layer of said transistor, connections to exposed surfaces of said one, adjacent, and fourth regions to form at least one transistor structure, and a second active element on one of the first, second and third regions, portions of the body physically and electrically internally interconnecting active regions of the transistor structure and of the second active element.

25. A network as set forth in claim 24 wherein a substantially short-circuited p-n junction extends transversely through the wafer adjacent one of said first, second and third regions.

References Cited by the Examiner

UNITED STATES PATENTS

| | | | |
|---|---|---|---|
| 2,663,806 | 12/1953 | Darlington | 317—235 |
| 2,666,814 | 1/1954 | Shockley | 317—235 |
| 2,787,564 | 4/1957 | Shockley | 148—1.5 |
| 2,816,228 | 12/1957 | Johnson | 317—234 |
| 2,861,018 | 11/1958 | Fuller | 148—1.5 |
| 2,985,804 | 5/1961 | Buie | 317—235 |
| 3,015,762 | 1/1962 | Shockley | 317—234 |
| 3,029,366 | 4/1962 | Lehovec | 317—101 |
| 3,043,726 | 7/1962 | Jochems | 148—177 |
| 3,062,690 | 11/1962 | Ross | 148—177 |
| 3,070,762 | 12/1962 | Evans | 333—70 |
| 3,100,276 | 8/1963 | Meyer | 317—234 |
| 3,108,210 | 10/1963 | Pankove | 317—235 |
| 3,111,611 | 11/1963 | Hunter | 317—235 |
| 3,115,581 | 12/1963 | Kilby | 317—235 |

FOREIGN PATENTS

| | | |
|---|---|---|
| 960,655 | 3/1957 | Germany. |

JOHN W. HUCKERT, *Primary Examiner.*

JAMES D. KALLAM, DAVID J. GALVIN, *Examiners.*

A. M. LESNIAK, *Assistant Examiner.*